(12) United States Patent
Hong et al.

(10) Patent No.: US 12,167,640 B2
(45) Date of Patent: Dec. 10, 2024

(54) DISPLAY DEVICE

(71) Applicant: Samsung Display Co., Ltd., Yongin-Si (KR)

(72) Inventors: Seokha Hong, Seoul (KR); Joon-Chul Goh, Suwon-si (KR)

(73) Assignee: Samsung Display Co., Ltd., Yongin-Si (KR)

( * ) Notice: Subject to any disclaimer, the term of this patent is extended or adjusted under 35 U.S.C. 154(b) by 427 days.

(21) Appl. No.: 17/719,556

(22) Filed: Apr. 13, 2022

(65) Prior Publication Data
US 2023/0059858 A1 Feb. 23, 2023

(30) Foreign Application Priority Data
Aug. 20, 2021 (KR) ........................ 10-2021-0110506

(51) Int. Cl.
*H10K 59/121* (2023.01)
*H10K 59/131* (2023.01)

(52) U.S. Cl.
CPC ..... *H10K 59/1213* (2023.02); *H10K 59/1216* (2023.02); *H10K 59/131* (2023.02)

(58) Field of Classification Search
None
See application file for complete search history.

(56) References Cited

U.S. PATENT DOCUMENTS

| | | | |
|---|---|---|---|
| 7,906,756 B2 | 3/2011 | Drummond et al. | |
| 7,944,415 B2 | 5/2011 | Jang et al. | |
| 8,810,139 B2 * | 8/2014 | Kim | G09G 3/3266 |
| | | | 315/169.3 |
| 9,626,902 B2 * | 4/2017 | Kwon | G09G 3/3233 |
| 10,803,800 B2 | 10/2020 | An | |
| 12,033,568 B2 * | 7/2024 | Lim | G09G 3/32 |
| 2010/0188320 A1 * | 7/2010 | Min | G09G 3/3291 |
| | | | 345/80 |
| 2014/0125643 A1 | 5/2014 | Kuo et al. | |

(Continued)

FOREIGN PATENT DOCUMENTS

| | | |
|---|---|---|
| KR | 10-0547515 B1 | 1/2006 |
| KR | 10-0751476 B1 | 8/2007 |

(Continued)

OTHER PUBLICATIONS

Seung-Eon Ahn et al., "High-Perfomance Nanowire Oxide Photo-Thin Film Transistors", Advanced Materials, www.advmat.de, www.MaterialsViews.com, 2013, pp. 5549-5554, WILEY-VCH Verlag Gmbh & Co. KGaA, Weinheim, wileyonlinelibrary.com.

*Primary Examiner* — Michael Lebentritt
(74) *Attorney, Agent, or Firm* — Innovation Counsel LLP

(57) ABSTRACT

Provided is a display device comprising a display panel including a plurality of pixels, one of the pixels includes a light emitting device, which is connected with a reference node to emit light, and a driving transistor connected between a power line, which is to receive a power supply voltage, and the reference node. a scan transistor, which is connected between a data line to receive a data signal and the driving transistor and receives a scan signal, a light receiving device, which is connected between a bias line to receive a bias voltage and the reference node, and receives the light, and a masking transistor which is connected between the reference node and the light receiving device and receives a masking signal.

9 Claims, 14 Drawing Sheets

(56) References Cited

U.S. PATENT DOCUMENTS

| | | | | |
|---|---|---|---|---|
| 2014/0375533 A1* | 12/2014 | Kim | ................... | G09G 3/3233 |
| | | | | 345/78 |
| 2016/0148571 A1* | 5/2016 | Cho | ................... | G09G 3/3266 |
| | | | | 345/212 |
| 2023/0196996 A1* | 6/2023 | Zhao | ................... | G09G 3/3233 |
| 2023/0215354 A1* | 7/2023 | Bae | ................... | G09G 3/3233 |
| | | | | 345/690 |

FOREIGN PATENT DOCUMENTS

| KR | 20160087058 A | * | 7/2016 |
|---|---|---|---|
| KR | 10-2019-0062652 A | | 6/2019 |

\* cited by examiner

DISPLAY DEVICE

CROSS-REFERENCE TO RELATED APPLICATIONS

This application claims priority under 35 U.S.C. § 119 to Korean Patent Application No. 10-2021-0110506 filed on Aug. 20, 2021, in the Korean Intellectual Property Office, the disclosures of which are incorporated by reference herein in their entireties.

BACKGROUND

Embodiments of the present disclosure described herein relate to a display device, and more particularly, relate to a display device for correcting an image displayed on a display panel.

Various types of display devices have been used to provide image information. In particular, the display device has employed an organic light emitting display (OLED) device, an inorganic light emitting display, a quantum dot display device, or a liquid crystal display (LCD).

The display device includes a display panel to display an image. The display panel includes pixels to emit light. Pixels in the OLED include organic light emitting diodes to emit light.

SUMMARY

Embodiments of the present disclosure provide a display device capable of correcting a quantity of light produced by a light emitting device through a light receive device, which receives light, thereby providing an image having excellent image quality to a user.

According to an embodiment, a display device includes a display panel including a plurality of pixels. Each of the pixels includes a light emitting device, which is connected with a reference node to emit light, and a driving transistor connected between a power line for receiving a power supply voltage, and the reference node. One of the pixels includes a scan transistor, which is connected between a data line for receiving a data signal and the driving transistor and receives a scan signal, a light receiving device, which is connected between a bias line for receiving a bias voltage and the reference node, and receive the light, and a masking transistor which is connected between the reference node and the light receiving device and receives a masking signal.

According to an embodiment of the present disclosure, the light receiving device has a correcting transistor including a first electrode connected with the bias line, a second electrode connected with the masking transistor, and a control electrode connected with the bias line.

According to an embodiment of the present disclosure, the masking transistor includes a first electrode connected with the second electrode of the correcting transistor, a second electrode connected with the reference node, and a control electrode to receive the masking signal.

According to an embodiment of the present disclosure, the light emitting device is connected between a common electrode for receiving a common voltage and the reference node. The common voltage may serve as the bias voltage and be supplied to the correcting transistor.

According to an embodiment of the present disclosure, the driving transistor includes a first electrode connected with the reference node, a second electrode connected with the power line, and a control electrode connected with the scan transistor. The scan transistor includes a first electrode connected with the control electrode of the driving transistor, a second electrode connected with the data line, and a control electrode to receive the scan signal.

According to an embodiment of the present disclosure, the scan signal includes a scan duration for turning on the scan transistor. The masking signal includes a masking duration for turning on the masking transistor. The scan duration may precede the masking duration in one frame.

According to an embodiment of the present disclosure, the scan duration and the masking duration do not overlap each other in the frame.

According to an embodiment of the present disclosure, the display device further includes a capacitor connected between the control electrode of the driving transistor and the reference node, and an initialization transistor connected between the reference node and an initialization line configured to receive an initialization voltage. The initialization transistor includes a first electrode connected with the reference node, a second electrode connected with the initialization line, and a control electrode to receive the initialization signal.

According to an embodiment of the present disclosure, the scan signal includes a scan duration for turning on the scan transistor. The masking signal includes a masking duration for turning on the masking transistor. The initialization signal includes an initialization duration for turning on the initialization transistor. The initialization duration may precede the scan duration, and the scan duration may precede the masking duration in a frame.

According to an embodiment of the present disclosure, a display device may include a display panel including a plurality of pixels and a controller to generate a scan control signal and a masking control signal. The display device includes a gate driver to receive the scan control signal and the masking control signal and outputs a scan signal and a masking signal. Each pixel may include a light emitting unit, which receives the scan signal and produces light, and a corrector which is electrically connected with the light emitting unit, receives the masking signal and the light, and corrects a quantity of the light produced by the light emitting unit.

According to an embodiment of the present disclosure, the masking signal may include a masking duration, and the corrector variously corrects the quantity of light depending on a width of the masking duration.

According to an embodiment of the present disclosure, the controller may include a degradation calculator which accumulates image data in every frame, and generates degradation data based on image data previously accumulated, and a generator which generates the masking control signal, based on the degradation data.

According to an embodiment of the present disclosure, as a degradation value included in the degradation data is increased, the width of the masking duration may be increased.

According to an embodiment of the present disclosure, the corrector may correct the quantity of the light produced by the light emitting unit such that the quantity of the light is reduced. As the width of the masking duration is increased, the quantity of light corrected by the corrector may be increased.

According to an embodiment of the present disclosure, the display panel includes a first display area and a second display area. The degradation data includes first degradation data dedicated for a first display area and second degradation data dedicated for second display area.

According to an embodiment of the present disclosure, the masking control signal is generated based on the first degradation data and the second degradation data. The masking signal includes a first masking signal applied to first pixels, which are disposed in the first display area, of the plurality of pixels and a second masking signal applied to second pixels, which are disposed in the second display area, of the plurality of pixels.

According to an embodiment of the present disclosure, a first degradation value included in the first degradation data is different from a second degradation value included in the second degradation data. The width of the first masking duration included in the first masking signal may be different from the width of the second masking duration included in the second masking signal.

According to an embodiment of the present disclosure, the second degradation value may be greater than the first degradation value, and the width of the second masking duration may be greater than the width of the first masking duration.

According to an embodiment of the present disclosure, the gate driver may include a scan driving block, which generates the scan signal, in response to the scan control signal, and a masking driving block which generates the masking signal, in response to the masking control signal.

According to an embodiment of the present disclosure, the light emitting unit includes a light emitting device, a driving transistor connected between the light emitting device and a power line for receiving a power supply voltage, and a scan transistor which is electrically connected between the data line and the driving transistor and receives the scan signal. The corrector includes a correcting device, which is connected between the light emitting device and a bias line for receiving a bias voltage, and a masking transistor connected between the light emitting device and the correcting device and receives the masking signal.

BRIEF DESCRIPTION OF THE DRAWINGS

The above and other objects and features of the present disclosure will become apparent by describing in detail embodiments thereof with reference to the accompanying drawings.

DETAILED DESCRIPTION

Figure 1:
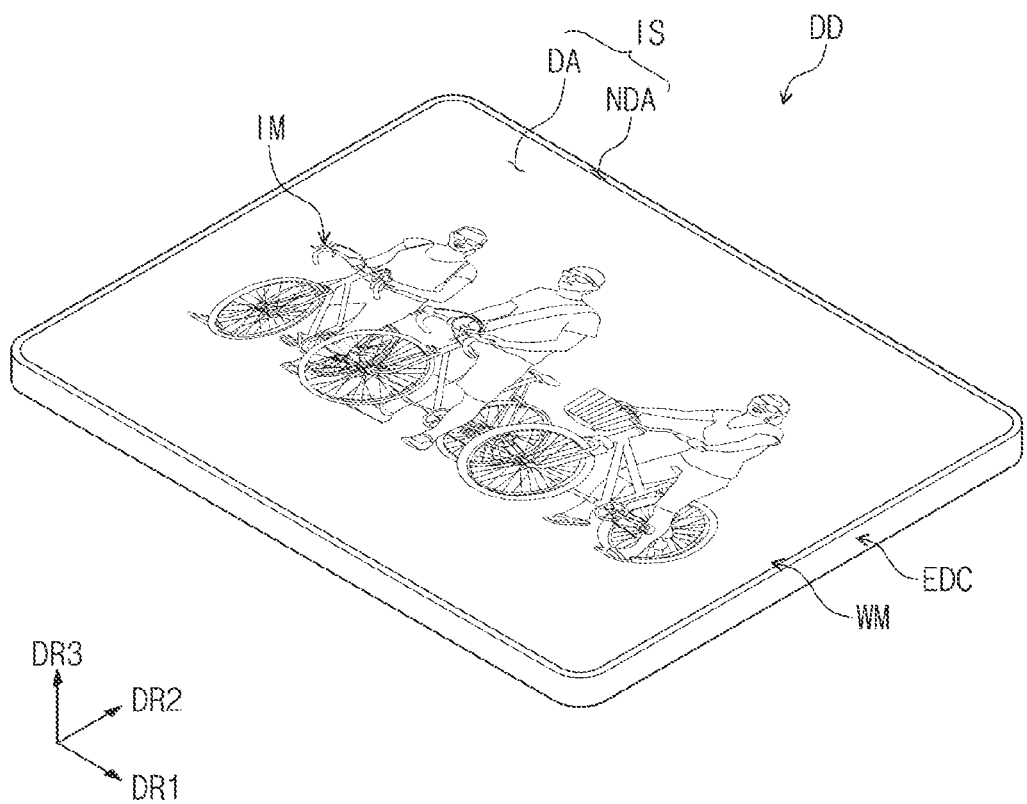
FIG. 1 is a perspective view illustrating a display device, according to an embodiment of the present disclosure.

In the specification, the expression that a first component (or area, layer, part, portion, etc.) is "on", "connected with", or "coupled with" a second component means that the first component is directly on, connected with, or coupled with the second component or means that a third component is interposed therebetween.

The same reference numeral will be assigned to the same component. The thickness, ratio, and size of each components illustrated in the drawings may be exaggerated for the purpose of effectively explaining the technical content. The term "and/or" includes one or more combinations of the associated listed items.

Although the terms "first", "second", etc. may be used to describe various components, the components should not be construed as being limited by the terms. The terms are only used to distinguish one component from another component. For example, without departing from the scope and spirit of the invention, a first component may be referred to as a second component, and similarly, the second component may be referred to as the first component. The singular forms are intended to include the plural forms unless the context clearly indicates otherwise.

Also, the terms "under", "below", "on", "above", etc. are used to describe the correlation of components illustrated in drawings. The terms that are relative in concept are described based on a direction shown in drawings.

It will be understood that the terms "include", "comprise", "have", etc. specify the presence of features, numbers, steps, operations, elements, or components, described in the specification, or a combination thereof, not precluding the presence or additional possibility of one or more other features, numbers, steps, operations, elements, or components or a combination thereof.

Unless otherwise defined, all terms used herein (including technical or scientific terms) have the same meanings as those generally understood by those skilled in the art to which the present disclosure pertains. Furthermore, terms such as terms defined in the dictionaries commonly used should be interpreted as having a meaning consistent with the meaning in the context of the related technology, and should not be interpreted in ideal or overly formal meanings unless explicitly defined herein.

Hereinafter, embodiments of the present disclosure will be described with reference to accompanying drawings.

Figure 2:
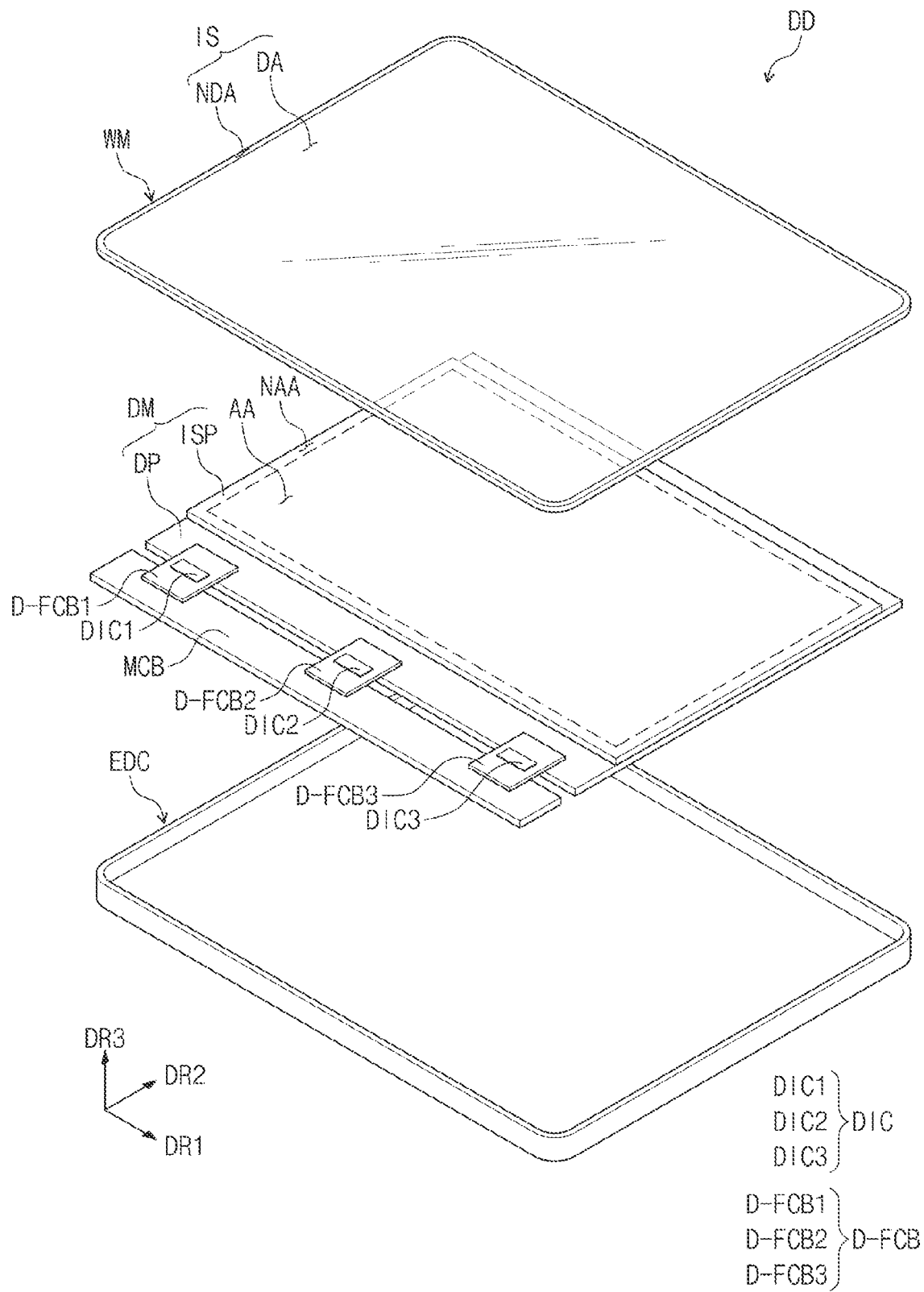
FIG. 2 is an exploded perspective view illustrating a display device, according to an embodiment of the present disclosure.

FIG. 1 is a perspective view of a display device, according to an embodiment of the present disclosure, and FIG. 2 is an exploded perspective view of a display device, according to an embodiment of the present disclosure.

Referring to FIGS. 1 and 2, a display device DD is a device activated in response to an electrical signal. According to the present disclosure, the display device DD may include a large-size display device, such as a television or a monitor, or a small or medium-size display device, such as a cellular phone, a tablet, a laptop computer, a vehicle navigation system, or a game machine. The above examples are provided only as an embodiment, and it is obvious that the display device DD may be applied to any other electronic device(s) without departing from the concept of the present disclosure. The display device DD has a rectangular shape having a longer side in a first direction DR1, and a shorter side in a second direction DR2 crossing the first direction DR1. However, the shape of the display device DD is not limited thereto, and various display devices DD having various shapes may be provided. The display device DD may display an image IM in a third direction DR3, on a display surface IS parallel to the first direction DR1 and the second direction DR2. The display surface IS on which the image IM is displayed may correspond to a front surface of the display device DD.

According to an embodiment, a front surface (or top surface) and a rear surface (or a bottom surface) of each of members are defined based on a direction that the image IM is displayed. The front surface and the rear surface are opposite to each other in the third direction DR3, and a normal direction to the front surface and the rear surface may parallel to the third direction DR3.

The distance between the front surface and the rear surface in the third direction DR3 may correspond to the thickness of the display device DD in the third direction DR3. Meanwhile, the first direction DR1, the second direction DR2, and the third direction DR3 may be relative concepts and may be changed to different directions.

The display device DD may sense an external input applied from the outside. The external input may include various inputs applied from an outside of the display device DD. According to an embodiment of the present disclosure, the display device DD may sense an external input of the user, which is applied from the outside. The external input of the user may include any one of various external inputs, such as a part of a body of the user, light, heat, a gaze, or pressure, or the combination thereof. In addition, the display device DD may sense the external input of the user, which is applied to the side surface or the rear surface of the display device DD depending on the structures of the display device DD, and is not limited to any one embodiment. For example, according to an embodiment, the external input may include an input made by an input device (e.g., a stylus pen, an active pen, a touch pen, an electronic pen, or an e-pen).

The display surface IS of the display device DD may be divided into a display area DA and a non-display area NDA. The display area DA may be an area to display an image. The user views the image through the display area DA. According to the present embodiment, the display area DA is shown as a rectangular shape rounded in vertexes. However, this is illustrated as an example. The display area DA may have various shapes, and not limited to any one embodiment.

The non-display area NDA is adjacent to the display area DA. The non-display area NDA may have a specific color. The non-display area NDA may surround the display area DA. The shape of the display area DA may actually be defined by the non-display area NDA. However, this is illustrated by way of example. For example, the non-display area NDA may be disposed adjacent to only one side of the display area DA or may be omitted. According to an embodiment of the present disclosure, the display device DD may include various embodiments, and not limited to any one embodiment.

As illustrated in FIG. 2, the display device DD may include a display module DM and a window WM disposed on the display module DM. The display module DM includes a display panel DP and an input sensing layer ISP.

According to an embodiment of the present disclosure, the display panel DP may include an emissive display panel. For example, the display panel DP may be an organic light emitting display panel, an inorganic light emitting display panel, a quantum dot light transmitting display panel. A light emitting layer of the organic light emitting display panel may include an organic light emitting material. A light emitting layer of the inorganic light emitting display panel may include an inorganic light emitting material. A light emitting layer of the quantum dot light emitting display panel may include a quantum dot and a quantum rod. The following description will be made that the display panel DP includes an organic light emitting display panel, according to the present embodiment.

The display panel DP may output the image IM, and the output image IM may be displayed on the display surface IS.

The input sensing layer ISP may be disposed on the display panel DP to sense an external input. The input sensing layer ISP may be directly disposed on the display panel DP. According to an embodiment of the present disclosure, the input sensing layer ISP may be formed on the display panel DP through a subsequent process. In other words, when the input sensing layer ISP is directly disposed on the display panel DP, an inner adhesive film (not illustrated) is not interposed between the input sensing layer ISP and the display panel DP. However, the inner adhesive film may be interposed between the input sensing layer ISP and the display panel DP. In this case, the input sensing layer ISP is not fabricated together with the display panel DP through the subsequent processes. In other words, after fabricating the input sensing layer ISP through a process separate from that of the display panel DP, the input sensing layer ISP may be fixed on a top surface of the display panel DP through the inner adhesive film.

The window WM may include a transparent material to output the image IM. For example, the window WM may include glass, sapphire, or plastic. Although the window WM is illustrated in a single layer, the present disclosure is not limited thereto. For example, the window WM may include a plurality of layers.

Meanwhile, although not illustrated, the non-display area NDA of the display device DD may be actually provided by printing one area of the window WM with a material including a specific color. According to an embodiment of the present disclosure, the window WM may include a blocking pattern for defining the non-display area NDA. The blocking pattern, which has the form of an organic film having a color, may be, for example, formed in a coating manner.

The window WM may be coupled to the display module DM through an adhesive film interposed therebetween. According to an embodiment of the present disclosure, the adhesive film may include an optically clear adhesive film (OCA, not shown). However, the adhesive film is not limited thereto, but may include a typical adhesive agent and adhesion agent. For example, the adhesive film may include optically clear resin (OCR, not shown), or a pressure sensitive adhesive film (PSA, not shown).

An anti-reflective layer may be further interposed between the window WM and the display module DM. The anti-reflective layer reduces a reflective index of external light incident from an upper portion of the window WM. According to an embodiment of the present disclosure, the anti-reflective layer may include a retarder and a polarizer. The retarder may be a retarder of a film type or a liquid crystal coating type and may include a 212 retarder and/or a 214 retarder. The polarizer may be provided in a film type or a liquid coating type. The film-type polarizer may include a stretched synthetic resin film, and the liquid crystal coating-type polarizer may include liquid crystals aligned in a predetermined array. The retarder and the polarizer may be implemented with one polarizing film.

According to an embodiment of the present disclosure, the anti-reflective layer may include color filters. The arrangement of the color filters may be determined based on colors of light generated from a plurality of pixels PX (see FIG. 3) included in the display panel DP. The anti-reflective layer may further include a light blocking pattern.

The display module DM may display the image IM, and may transmit/receive information about an external input, in response to an electrical signal. The display module DM may be defined with an active area AA and a non-active area NAA. The active area AA may be defined as an area in the display module DM, which outputs the image IM provided. In addition, the active area AA may be defined as an area in which the input sensing layer ISP senses the external input applied from the outside.

The non-active area NAA may be adjacent to the active area AA. For example, the non-active area NAA may surround the active area AA. However, this is illustrated by way of an example. For example, the non-active area NAA may have various shapes, and not limited to any one embodiment. According to an embodiment, the active area AA of the display module DM may correspond to at least a portion of the display area DA.

The display module DM may further include a main circuit board MCB, a plurality of flexible circuit films D-FCB, and a plurality of driving chips DIC. The main circuit board MCB may be connected with the flexible circuit films D-FCB and electrically connected with the display panel DP. The flexible circuit films D-FCB are connected with the display panel DP to electrically connect the display panel DP with the main circuit board MCB. The main circuit board MCB may include a plurality of driving devices. The plurality of driving devices may include a circuit part to drive the display panel DP. The driving chips DIC may be mounted on the flexible circuit films D-FCB.

According to an embodiment of the present disclosure, the flexible circuit films D-FCB may include a first flexible circuit film D-FCB1, a second flexible circuit film D-FCB2, and a third flexible circuit film D-FCB3. The driving chips DIC may include a first driving chip DIC1, a second driving chip DIC2, and a third driving chip DIC3. The first to third flexible circuit films D-FCB1, D-FCB2, and D-FCB3 are disposed to be spaced apart from each other in the first direction DR1, and connected with the display panel DP to electrically connect the display panel DP with the main circuit board MCB. The first driving chip DIC1 may be mounted on the first flexible circuit film D-FCB1. The second driving chip DIC2 may be mounted on the second flexible circuit film D-FCB2. The third driving chip DIC3 may be mounted on the third flexible circuit film D-FCB3. However, the present disclosure is not limited thereto. For example, the display panel DP may be electrically connected with the main circuit board MCB through one flexible circuit film, and only one driving chip may be mounted on one flexible circuit film. In addition, the display panel DP may be electrically connected with the main circuit board MCB through at least four flexible circuit films, and driving chips may be mounted on the flexible circuit films, respectively.

Although FIG. 2 illustrates that the first to third driving chips DIC1, DIC2, and DIC3 are mounted on the first to third flexible circuit films D-FCB1, D-FCB2, and D-FCB3, respectively, the present disclosure is not limited thereto. For example, the first to third driving chips DIC1, DIC2, and DIC3 may be directly mounted on the display panel DP. In this case, a part, on which the driving chips DIC1, DIC2, and DIC3 are mounted, of the display panel DP may be bent and disposed on a rear surface of the display module DM. For example, the first to third driving chips DIC1, DIC2, and DIC3 may be directly mounted on the display panel DP.

The input sensing layer ISP may be electrically connected with the main circuit board MCB through the flexible circuit films D-FCB. However, the present disclosure is not limited thereto. In other words, the display module DM may additionally include an additional flexible circuit film to electrically connect the input sensing layer ISP with the main circuit board MCB.

The display device DD may further include an external case EDC to receive the display module DM. The external case EDC may be coupled to the window WM to define the outer appearance of the display device DD. The external case EDC may absorb the impact applied from the outside and may prevent a foreign material/moisture from being infiltrated into the display module DM to protect components received in the external case EDC. Meanwhile, according to an embodiment, the external case EDC may be provided in the form that a plurality of receiving members are assembled.

According to an embodiment, the display device DD may further include an electronic module having various functional modules to operate the display module DM, a power supply module to supply power for the overall operation of the display device DD, and a bracket coupled to the display module DM and/or the external case EDC to split the internal space of the display device DD.

Figure 3:
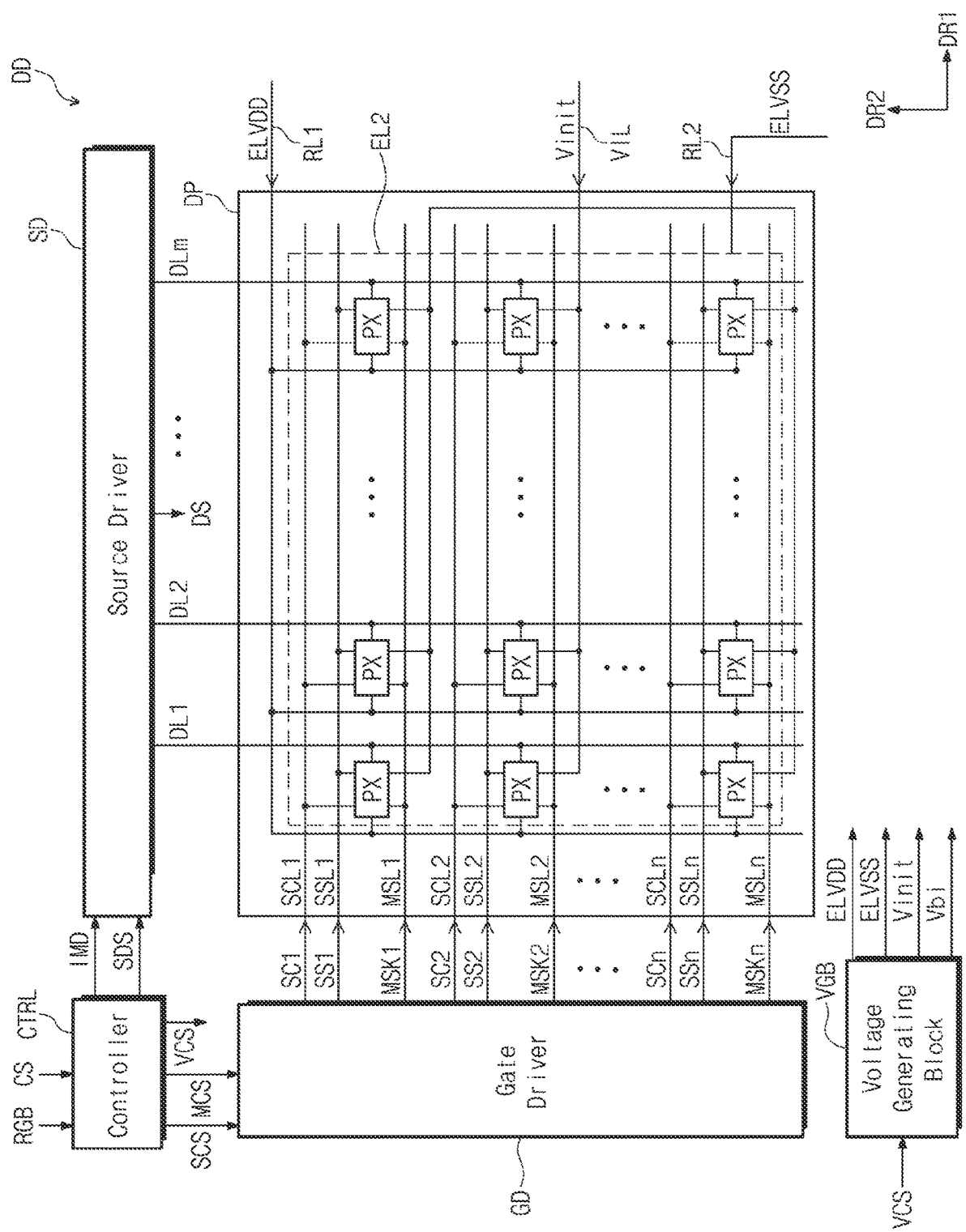
FIG. 3 is a diagram illustrating a display device, according to an embodiment of the present disclosure.

FIG. 3 is a block diagram illustrating a display device, according to an embodiment of the present disclosure.

Referring to FIG. 3, the display device DD may include the display panel DP, a controller CTRL, a source driver SD, a gate driver GD, and a voltage generating block VGB.

According to an embodiment of the present disclosure, the controller CTRL receives an image signal RGB and a control signal CS from the outside. The controller CTRL may transform a data format of the image signal RGB to generate image data IMD to be matched with the specification of an interface with the source driver SD. The controller CTRL generates a source driving signal SDS, a scan control signal SCS, a masking control signal MCS, and a voltage control signal VCS, in response to the control signal CS. According to an embodiment of the present disclosure, the controller CTRL may generate the masking control signal MCS, in response to the control signal CS and the image signal RGB. The control signal CS may include a vertical synchronization signal, a horizontal synchronization signal, and a main clock.

The controller CTRL transmits the image data IMD and the source driving signal SDS to the source driver SD. The source driving signal SDS may include a horizontal start signal to start the operation of the source driver SD. The source driver SD generates a data signal DS, in response to the image data IMD, in response to the source driving signal SDS. The source driver SD outputs the data signal DS to a plurality of data lines DL1 to DLm to be described later. The data signal DS is an analog voltage corresponding to a grayscale value of the image data IMD.

The controller CTRL transmits the scan control signal SCS and the masking control signal MCS to the gate driver GD. The gate driver GD generates scan signals SC1 to SCn and initialization signals SS1 to SSn, in response to the scan control signal SCS. The gate driver GD outputs the scan signals SC1 to SCn to a plurality of scan lines SCL1 to SCLn to be described later, and outputs the initialization signals SS1 to SSn to a plurality of initialization lines SSL1 to SSLn to be described later. The gate driver GD generates masking signals MSK1 to MSKn, in response to the masking control signal MCS. The gate driver GD outputs the masking signals MSK1 to MSKn to a plurality of masking lines MSL1 to MSLn to be described later.

The controller CTRL transmits the voltage control signal VCS to the voltage generating block VGB. The voltage generating block VGB generates voltages necessary for the operation of the display panel DP, in response to the voltage control signal VCS. According to an embodiment of the present disclosure, the voltage generating block VGB generates a power supply voltage ELVDD, a common voltage ELVSS, an initialization voltage Vinit, and a bias voltage Vbi. According to an embodiment of the present disclosure, the voltage generating block VGB may operate depending on the control of the controller CTRL. According to an embodiment of the present disclosure, the voltage level of the power supply voltage ELVDD is greater than a voltage level of the common voltage ELVSS. According to an embodiment of the present disclosure, the voltage level of the power supply voltage ELVDD is the range of about 20 V to 30 V. The voltage level of the initialization voltage Vinit is lower than the voltage level of the common voltage ELVSS. According to an embodiment of the present disclosure, the voltage level of the initialization voltage Vinit may be in the range about 1 V to 9 V. The voltage level of the common voltage ELVSS may be lower than the voltage level of the power supply voltage ELVDD. According to an embodiment of the present disclosure, the voltage level of the common voltage ELVSS may be about 0 V.

According to an embodiment of the present disclosure, the display panel DP includes the plurality of scan lines SCL1 to SCLn, the plurality of initialization lines SSL1 to SSLn, the plurality of masking lines MSL1 to MSLn, the plurality of data lines DL1 to DLm, and the plurality of pixels PX.

The scan lines SCL1 to SCLn, the initialization lines SSL1 to SSLn, and the masking lines MSL1 to MSLn extend from the gate driver in the first direction DR1, and are arranged to be spaced apart from each other in the second direction DR2. The data lines DL1 to DLm extend in a direction opposite to the second direction DR2 from the source driver SD, and are arranged to be spaced apart from each other in the first direction DR1.

Each of the pixels PX is electrically connected with one corresponding scan line of the scan lines SCL1 to SCLn, one corresponding initialization line of the initialization lines SSL1 to SSLn, and one corresponding masking line of the masking lines MSL1 to MSLn. In addition, each pixel PX is electrically connected with one corresponding data line of the data lines DL1 to DLm.

Each of the pixels PX is electrically connected with a first power line RL1, a common electrode EL2, and an initialization power line VIL. According to an embodiment of the present disclosure, each of the pixels PX may be electrically connected with a bias line VBL (see FIG. 5A). The first power line RL1 receives the power supply voltage ELVDD from the voltage generating block VGB. The common electrode EL2 receives the common voltage ELVSS from the voltage generating block VGB. According to an embodiment of the present disclosure, the common electrode EL2 may receive the common voltage ELVSS from the voltage generating block VGB through a second power line RL2 electrically connected with the voltage generating block VGB. The initialization power line VIL receives the initialization voltage Vinit from the voltage generating block VGB. The bias line VBL (see FIG. 5A) receives the bias voltage Vbi from the voltage generating block VGB. However, according to an embodiment of the present disclosure, the connection relationship among the pixels PX and the scan lines SCL1 to SCLn, the initialization lines SSL1 to SSLn, the masking lines MSL1 to MSLn, and the data lines DL1 to DLm may be varied, depending on the configuration of the driving circuits of the pixels PX.

Each pixel PX may include a light emitting diode to produce a color light. For example, the pixels PX may include red pixels to produce a red color light, green pixels to produce a green color light, and blue pixels to produce a blue color light. A light emitting diode of a red pixel, a light emitting diode of a green pixel, and a light emitting diode of a blue pixel may include light emitting layers including mutually different materials. According to an embodiment of the present disclosure, each of the pixels PX may include white pixels to produce a white color light. In this case, an anti-reflective layer included in the display device DD may further include color filters. The display device DD may display the image IM (see FIG. 1) based on light output after white color light passes through the color filters. However, according to an embodiment of the present disclosure, the pixels PX may include blue pixels to produce the blue color light. In this case, the display device DD may display the image IM based on light output after the blue color light passes through color filters. According to an embodiment of the present disclosure, when the blue color light passes through the color filters, the light after passing through the color filters may have blue color light and color having various wavelengths. According to an embodiment of the present disclosure, color filters may include quantum dots. The quantum dot is a particle to adjust the wavelength of light emitted, as the wavelength of incident light is converted. The quantum dot may adjust the wavelength of the light emitted based on a particle size. Accordingly, the quantum dot may emit light including red color light, green color light, and blue color light.

Figure 4:
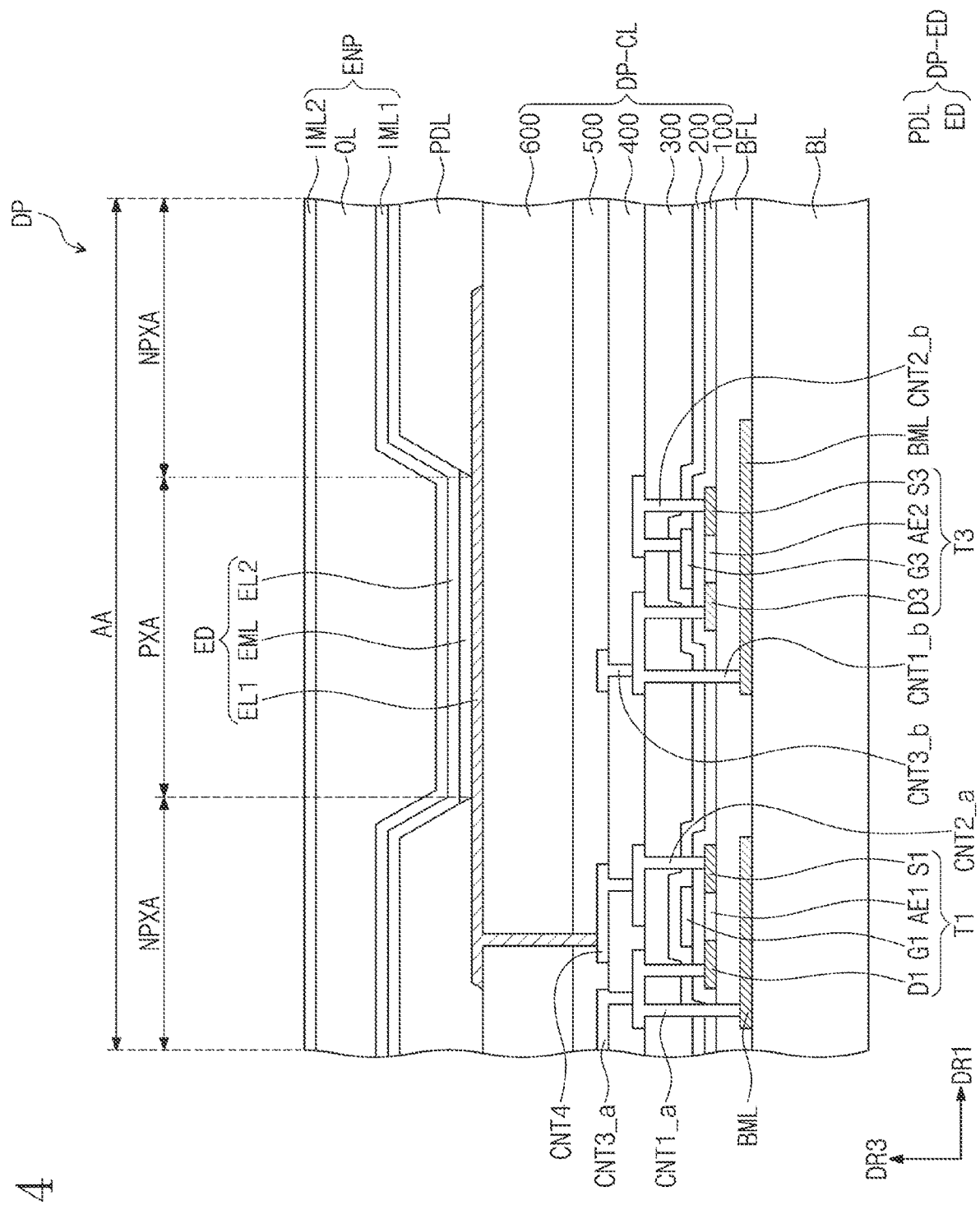
FIG. 4 is a cross-sectional view of a partial area of a display panel, according to an embodiment of the present disclosure.

FIG. 4 is a cross-sectional view of a partial area of a display panel, according to an embodiment of the present disclosure.

Referring to FIG. 4, the display panel DP includes a base layer BL, a circuit device layer DP-CL, a display device layer DP-ED, and an encapsulating layer ENP.

According to an embodiment of the present disclosure, the base layer BL may be a member to provide a base surface on which the circuit device layer DP-CL is disposed. The base layer BL may be a stack structure including a plastic substrate, an insulating film, or a plurality of insulating layers. According to an embodiment of the present disclosure, the base layer BL may include a synthetic resin layer. The synthetic resin layer may include a thermosetting resin. For example, the base layer BL may have a three-layer structure of a synthetic resin layer, an adhesive layer, and a synthetic resin layer. In particular, the synthetic resin layer may be a polyimide-based resin layer, and the material of the synthetic resin layer is not specifically limited. The synthetic resin layer may include at least one of an acrylic resin, a methacrylic resin, polyisoprene, a vinyl resin, an epoxy resin, an urethane resin, a cellulose resin, a siloxane resin, a polyamide resin, and a perylene resin. In addition, the base layer BL may include a glass substrate, a metal substrate, or an organic/inorganic composite material substrate.

The circuit device layer DP-CL may be disposed on the base layer BL. The circuit device layer DP-CL may include a plurality of intermediate insulating layers, a semiconductor pattern, a conductive pattern, and a signal line. The intermediate insulating layer, the semiconductor layer, and the conductive layer may be formed on the base layer BL through a coating process, and a depositing process. Thereafter, the intermediate insulating layer, the semiconductor layer, and the conductive layer may be selectively patterned through a photolithography process. The semiconductor pattern, the conductive pattern, and the signal line included in the circuit device layer DP-CL may be formed in such a manner.

According to an embodiment of the present disclosure, the circuit device layer DP-CL may include a blocking pattern BML, a buffer layer BFL, a first intermediate insulating layer 100, a second intermediate insulating layer 200, a third intermediate insulating layer 300, a fourth intermediate insulating layer 400, a fifth intermediate insulating layer 500 and a sixth intermediate insulating layer 600.

According to an embodiment of the present disclosure, the blocking pattern BML may be disposed on the base layer BL. Meanwhile, although not illustrated, a buffer layer may be further interposed between the base layer BL and the blocking pattern BML. The blocking pattern BML may include a conductive material. The blocking pattern BML may include molybdenum (Mo). The blocking pattern BML may include at least one of an aluminum oxide, a titanium oxide, a zirconium oxide, or a hafnium oxide.

According to an embodiment of the present disclosure, the blocking pattern BML may overlap a driving transistor T1 and a light receiving device. Although FIG. 4 illustrates the structure in which the light receiving device includes a photo-transistor, the present disclosure is not limited thereto. Alternatively, the light receiving device may include a photo-diode. Hereinafter, for the convenience of explanation, the light receiving device will be referred to as a correcting transistor T3. That is, the blocking pattern BML may overlap the driving transistor T1 and the correcting transistor T3. The blocking pattern BML may prevent electrical characteristics of semiconductor patterns S1, AE1, and D1 of the driving transistor T1 and semiconductor patterns S3, AE2, and D3 of the correcting transistor T3 from being degraded by an external light. In addition, the blocking pattern BML may block electric potential, which results from a polarization phenomenon of the base layer BL, from exerting an influence on the driving transistor T1 and the correcting transistor T3.

The buffer layer BFL may be disposed on the base layer BL and the blocking pattern BML. The buffer layer BFL may cover the blocking pattern BML. The buffer layer BFL may improve a bonding force between the base layer BL and the semiconductor pattern. The buffer layer BFL may include an inorganic material. The buffer layer BFL may include a silicon oxide layer and a silicon nitride layer, and the silicon oxide layer and the silicon nitride layer may be alternately stacked.

The semiconductor pattern may be disposed on the buffer layer BFL. The semiconductor pattern may include polysilicon. However, the embodiment is not limited thereto, and the semiconductor pattern may include amorphous silicon or a metal oxide.

FIG. 4 merely illustrates some semiconductor patterns, and semiconductor patterns may be additionally disposed in another area of a pixel, when viewed in a plan view. The semiconductor pattern may be arranged in a specific rule, across the pixels. The semiconductor pattern may have a different electrical property depending on whether doped. The semiconductor pattern may include a first semiconductor area having higher conductivity and a second semiconductor area having lower conductivity. The first semiconductor area may be doped with N-type dopants or P-type dopants. A P-type transistor includes a doping area doped with the P-type dopants. The second semiconductor area may be anon-doping area or may be doped with a lighter concentration, as compared to the first semiconductor area.

The conductivity of the first semiconductor area may be greater than that of the second semiconductor area, and may actually serve as an electrode or a signal line. The second semiconductor area actually corresponds to a channel (or active) area of a transistor. In other words, a portion of the semiconductor pattern may be the channel area of the transistor, and another portion of the semiconductor pattern may be a source electrode or a drain electrode of the transistor. In addition, another portion of the semiconductor pattern may be a connection electrode or a connection signal line.

As illustrated in FIG. 4, the source electrode S1, the channel area AE1, and the drain electrode D1 of the driving transistor T1 are formed from a semiconductor pattern. In addition, the source electrode S3, the channel area AE2, and the drain electrode D3 of the correcting transistor T3 are also formed from a semiconductor pattern. The source electrode S1 and the drain electrode D1 of the driving transistor T1 may extend in opposite directions from the channel area AE1, when viewed in a cross-sectional view. The source electrode S3 and the drain electrode D3 of the correcting transistor T3 may extend in opposite directions from the channel area AE2, when viewed in a cross-sectional view.

The first intermediate insulating layer 100 is disposed on the buffer layer BFL. The first intermediate insulating layer 100 overlaps a plurality of pixels in common to cover a semiconductor pattern. The first intermediate insulating layer 100 may be an inorganic layer and/or an organic layer, and may have a single-layer structure or a multi-layer structure. The first intermediate insulating layer 100 may include at least one of an aluminum oxide, a titanium oxide, a silicon oxide, a silicon oxynitride, a zirconium oxide, or a hafnium oxide. According to the present embodiment, the first intermediate insulating layer 100 may be a single-layer silicon oxide layer. Each of the second to sixth intermediate insulating layers 200, 300, 400, 500 and 600 as well as the first intermediate insulating layer 100 may be an inorganic layer and/or an organic layer, and may have a single-layer structure or a multi-layer structure. The inorganic layer may include at least one of the above-described materials.

Agate electrode G1 of the driving transistor T1 and a gate electrode G3 of the correcting transistor T3 are disposed on the first intermediate insulating layer 100. The gate electrode G1 of the driving transistor T1 and the gate electrode G3 of the correcting transistor T3 may be portions of a metal pattern. The gate electrode G1 of the driving transistor T1 may overlap the channel area AE1 of the driving transistor T1. The gate electrode G3 of the correcting transistor T3 may overlap the channel area AE2 of the correcting transistor T3. In the process of doping the semiconductor pattern, the gate electrode G1 of the driving transistor T1 and the gate electrode G3 of the correcting transistor T3 may function as masks.

The second intermediate insulating layer 200 is disposed on the first intermediate insulating layer 100 to cover the gate electrode G1 of the driving transistor T1 and the gate electrode G3 of the correcting transistor T3. The second intermediate insulating layer 200 may overlap pixels in common. The second intermediate insulating layer 200 may be an inorganic layer and/or an organic layer, and may have a single-layer structure or a multi-layer structure. According to the present embodiment, the second intermediate insulating layer 200 may be a single-layer silicon oxide layer.

The third intermediate insulating layer 300 is disposed on the second intermediate insulating layer 200. The third intermediate insulating layer 300 may overlap pixels in common. The third intermediate insulating layer 300 may be an inorganic layer and/or an organic layer, and may have a single-layer structure or a multi-layer structure. According to the present embodiment, the third intermediate insulating layer 300 may be a single-layer silicon oxide layer.

A first connection electrode CNT1_a, a second connection electrode CNT1_b, a third connection electrode CNT2_a, and a fourth connection electrode CNT2_b may be disposed on the third intermediate insulating layer 300.

The first connection electrode CNT1_a may be electrically connected with the drain electrode D1 of the driving transistor T1 through a contact hole formed through the first to third intermediate insulating layers 100, 200, and 300. In addition, the first connection electrode CNT1_a may be electrically connected with the blocking pattern BML through a contact hole formed through the buffer layer BFL and the first to third intermediate insulating layers 100, 200, and 300. Accordingly, the drain electrode D1 of the driving transistor T1 may be electrically connected with the blocking pattern BML.

The third connection electrode CNT2_a may be electrically connected with the source electrode S1 of the driving transistor T1 through a contact hole formed through the first to third intermediate insulating layers 100, 200, and 300.

The second connection electrode CNT1_b may be electrically connected with the drain electrode D3 of the correcting transistor T3 through a contact hole formed through the first to third intermediate insulating layers 100, 200, and 300. In addition, the second connection electrode CNT1_b may be electrically connected with the blocking pattern BML through a contact hole formed through the buffer layer BFL and the first to third intermediate insulating layers 100, 200, and 300. Accordingly, the drain electrode D3 of the correcting transistor T3 may be electrically connected with the blocking pattern BML.

The fourth connection electrode CNT2_b may be electrically connected with the source electrode S3 of the correcting transistor T3 through a contact hole formed through the first to third intermediate insulating layers 100, 200, and 300. The fourth connection electrode CNT2_b may be electrically connected with the gate electrode G3 of the correcting transistor T3 through a contact hole formed through the second and third intermediate insulating layers 200 and 300. Accordingly, the gate electrode G3 of the correcting transistor T3 may be electrically connected with the source electrode S3. Although not illustrated, the fourth connection electrode CNT2_b may be electrically connected with the bias line VBL (see FIG. 5A).

The fourth intermediate insulating layer 400 may be disposed on the third intermediate insulating layer 300. The fourth intermediate insulating layer 400 may be a single-layer silicon oxide layer. The fourth intermediate insulating layer 400 may cover the first to fourth connection electrodes CNT1_a, CNT2_a, CNT1_b, and CNT2_b.

A fifth connection electrode CNT3_a, a sixth connection electrode CNT3_b, and a seventh connection electrode CNT4 may be disposed on the fourth intermediate insulating layer 400. According to an embodiment of the present disclosure, referring to FIGS. 3 and 4, not only fifth to seventh connection electrodes CNT3_a, CNT3_b, and CNT4, but also some of signal lines, for example, the scan lines SCL1 to SCLn, and the initialization lines SSL1 to SSLn, the masking signal lines MSL1 to MSLn, and the data lines DL1 to DLm may be disposed on the fourth intermediate insulating layer 400.

The fifth connection electrode CNT3_a may be electrically connected with the first connection electrode CNT1_a via a contact hole formed through the fourth intermediate insulating layer 400. Although not illustrated separately, the fifth connection electrode CNT3_a may be electrically connected with the first power line RL1, when viewed in a plan view.

The sixth connection electrode CNT3_b may be electrically connected with the second connection electrode CNT1_b via a contact hole formed through the fourth intermediate insulating layer 400. Although not illustrated, the sixth connection electrode CNT3_b may be electrically connected with a masking transistor T4 (see FIG. 5A).

The seventh connection electrode CNT4 may be electrically connected with the third connection electrode CNT2_a via a contact hole formed through the fourth intermediate insulating layer 400.

The fifth intermediate insulating layer 500 is disposed on the fourth intermediate insulating layer 400. The fifth intermediate insulating layer 500 may be an organic layer and/or an inorganic layer. The fifth intermediate insulating layer 500 may cover the fifth to seventh connection electrodes CNT3_a, CNT3_b, and CNT4.

The sixth intermediate insulating layer 600 is disposed on the fifth intermediate insulating layer 500. The sixth intermediate insulating layer 600 may be an organic layer. According to an embodiment of the present disclosure, the sixth intermediate insulating layer 600 may include polyimide. According to an embodiment of the present disclosure, the sixth intermediate insulating layer 600 may provide a flat surface on which the display device layer DP-ED is provided.

The display device layer DP-ED may be formed on the circuit device layer DP-CL. According to an embodiment of the present disclosure, the display device layer DP-ED may include a light emitting device ED and the pixel defining layer PDL.

The light emitting device ED includes a driving electrode EL1 disposed on the circuit device layer DP-CL, a light emitting layer EML disposed on the driving electrode EL1, and the common electrode EL2 disposed on the light emitting layer EML.

The driving electrode EL1 is disposed on the sixth intermediate insulating layer 600. The driving electrode EL1 is electrically connected with the seventh connection electrode CNT4 via a contact hole formed through the fifth and sixth intermediate insulating layers 500 and 600. Accordingly, the driving electrode EL1 is electrically connected with the source electrode S1 of the driving transistor T1.

The pixel defining layer PDL is disposed on the sixth intermediate insulating layer 600 and to cover a portion of the driving electrode EL1. A pixel opening part is defined in the pixel defining layer PDL. The pixel opening part exposes at least a portion of the driving electrode EL1. According to an embodiment of the present disclosure, a light emitting area PXA may correspond to a partial area, which is exposed through the pixel opening part, of the driving electrode EL1. A non-light emitting area NPXA may surround the light emitting area PXA.

The light emitting layer EML is disposed on the driving electrode EL1. The light emitting layer EML may be disposed in an area corresponding to the pixel opening part. In other words, the light emitting layer EML may be separately provided for each of pixels. The light emitting layer EML may include a light emitting material including a fluorescent material or a phosphorescent material. The light emitting material may include an organic light emitting material or an inorganic light emitting material, but is not limited any one of the organic light emitting material and the inorganic light emitting material.

The common electrode EL2 is disposed on the light emitting layer EML. The common electrode EL2 is provided in the form of one common electrode and is disposed in the plurality of pixels in common.

According to an embodiment of the present disclosure, the light emitting device ED may further include a hole control layer and an electron control layer. The hole control layer may be interposed between the driving electrode EU and the light emitting layer EML, and may further include a hole injection layer. The electron control layer may be interposed between the light emitting layer EML and the common electrode EL2, and may further include an electron injection layer.

The encapsulating layer ENP may be disposed on the display device layer DP-ED. Accordingly, the encapsulating layer ENP may be disposed on the common electrode EL2.

The encapsulating layer ENP is disposed in the plurality of pixels in common. According to the present embodiment, the encapsulating layer ENP may directly cover the common electrode EL2. According to an embodiment of the present disclosure, a capping layer may be further interposed between the encapsulating layer ENP and the common electrode EL2 to cover the common electrode EL2. In this case, the encapsulating layer ENP may directly cover the capping layer.

The encapsulating layer ENP may include a first inorganic layer IML1, an organic layer OL, and a second inorganic layer IML2. The first inorganic layer IML1 and the second inorganic layer IML2 protect the light emitting device ED from moisture and oxygen, and the organic layer OL interposed between the first inorganic layer IML1 and the second inorganic layer IML2 protects the light emitting device ED from a foreign substance such as a dust particle. The first inorganic layer MIA and the second inorganic layer IML2 may include a silicon nitride layer, a silicon oxynitride layer, a silicon oxide layer, a titanium oxide layer, or an aluminum oxide layer. The organic layer OL may include an acryl-based organic layer, but is not limited thereto.

The first inorganic layer IML1 may be disposed on the light emitting device ED. The organic layer OL is disposed on the first inorganic layer IML1. The second inorganic layer IML2 may be disposed on the organic layer OL.

Figure 5A:
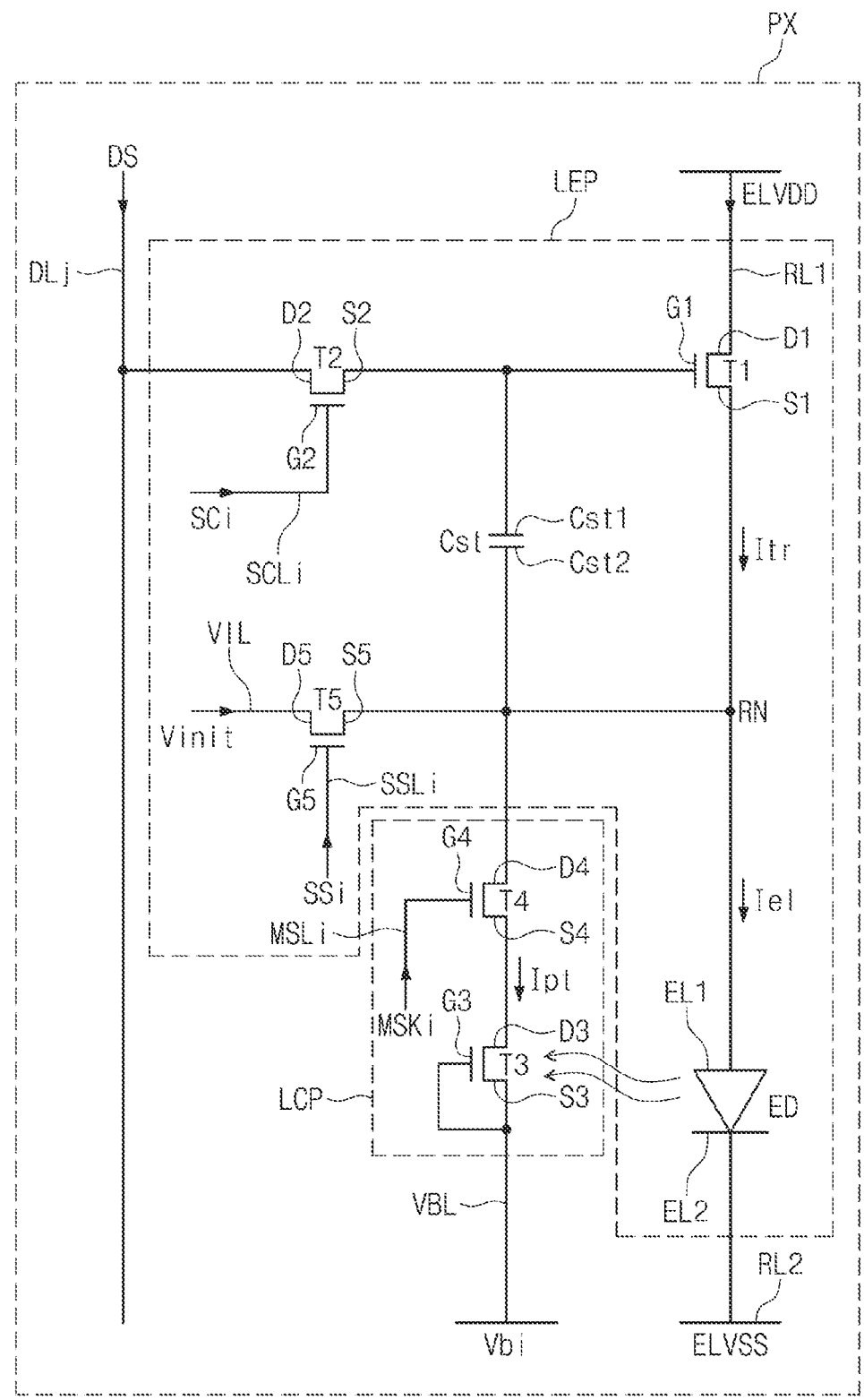
FIGS. 5A and 5B are circuit diagrams of a pixel, according to an embodiment of the present disclosure.
Figure 5B:
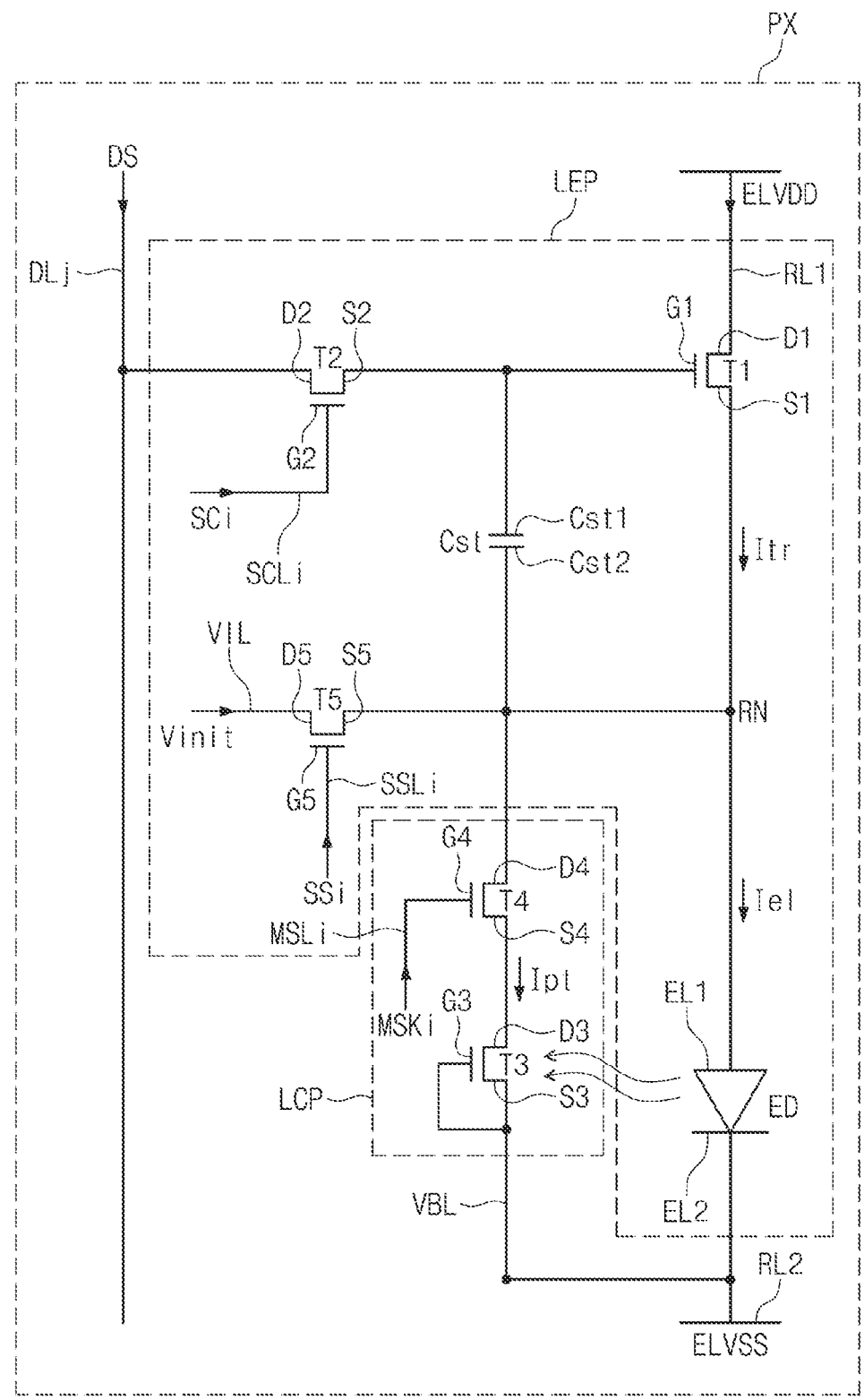

FIGS. 5A and 5B are circuit diagrams of a pixel, according to an embodiment of the present disclosure.

FIGS. 5A and 5B illustrate a circuit configuration of one pixel PX of plurality of pixels PX. The pixel PX is connected with an ith scan line SCLi of the scan lines SCL1 to SCLn, an ith initialization line SSLi of the initialization lines SSL1 to SSLn, an ith masking line MSLi of the masking lines MSL1 to MSLn, and a jth data line DLj of the data lines DL1 to DLm.

According to an embodiment of the present disclosure, the pixel PX may include a light emitting unit LEP and a corrector LCP. According to an embodiment of the present disclosure, the light emitting unit LEP may include the driving transistor T1, a scan transistor T2, an initialization transistor T5, a capacitor Cst, and the light emitting device ED. The corrector LCP may include the correcting transistor T3 and the masking transistor T4.

According to the present embodiment, the following description will be made while focusing on that each of the driving transistor T1, the scan transistor T2, the correcting transistor T3, the masking transistor T4, and the initialization transistor T5 is an N-type transistor. However, the present disclosure is not limited thereto. For example, the driving transistor T1, the scan transistor T2, the correcting transistor T3, the masking transistor T4, and the initialization transistor T5 may be realized with any one of a P-type transistor or an N-type transistor. In the present specification, the wording "a transistor is connected with a signal line" may refer to "any one of a source electrode, a drain electrode, and a gate electrode of the transistor is formed integrally with the signal line, or is connected with the signal line through a connection electrode". Alternatively, the wording "a transistor is electrically connected with another transistor" may refer to "any one of a source electrode, a drain electrode, and a gate electrode of the transistor is formed integrally with any one of a source electrode, a drain electrode, or a gate electrode of another transistor, or is connected with any one of a source electrode, a drain electrode, or a gate electrode of another transistor through a connection electrode". Each of the driving transistor T1, the scan transistor T2, the correcting transistor T3, the masking transistor T4, and the initialization transistor T5 includes a first electrode, a second electrode, and a control electrode. The first electrode is referred to as a source electrode, the second electrode is referred to as a drain electrode, and a control electrode is referred to as a gate electrode.

The light emitting device ED is connected between a reference node RN and the second power line RL2. According to an embodiment of the present disclosure, the driving electrode EU of the light emitting device ED is electrically connected with the reference node RN, and the common electrode EL2 of the light emitting device ED is electrically connected with the second power line RL2. The common voltage ELVSS is supplied to the second power line RL2

The driving transistor T1 is connected between the first power line RL1 and the reference node RN. The source electrode S1 of the driving transistor T1 is electrically connected with the reference node RN. The drain electrode D1 of the driving transistor T1 is electrically connected with the first power line RL1. The gate electrode G1 of the driving transistor T1 is electrically connected with the scan transistor T2. According to an embodiment of the present disclosure, the gate electrode G1 of the driving transistor T1 may be electrically connected with a source electrode S2 of the scan transistor T2. According to an embodiment of the present disclosure, the power supply voltage ELVDD may be transmitted to the drain electrode D1 of the driving transistor T1 through the first power line RL1

The scan transistor T2 is connected between the jth data line DLj and the gate electrode G1 of the driving transistor T1. The source electrode S2 of the scan transistor T2 is electrically connected with the gate electrode G1 of the driving transistor T1. A drain electrode D2 of the scan transistor T2 is electrically connected with the jth data line DLj. A gate electrode G2 of the scan transistor T2 is electrically connected with the ith scan line SCLi. According to an embodiment of the present disclosure, an ith scan signal SCi may be transmitted to the gate electrode G2 of the scan transistor T2 through the ith scan line SCLi. The data signal DS may be transmitted to the drain electrode D2 of the scan transistor T2 through the jth data line DLj.

The initialization transistor T5 is connected between the reference node RN and the initialization power line VIL. A source electrode S5 of the initialization transistor T5 is electrically connected with the reference node RN. The reference node RN may be a node electrically connected with the source electrode S1 of the driving transistor T1. The reference node RN may be a node electrically connected with the driving electrode EL1 of the light emitting device ED. A drain electrode D5 of the initialization transistor T5 is electrically connected with the initialization power line VIL. A gate electrode G5 of the initialization transistor T5 is electrically connected with the ith initialization line SSLi. According to an embodiment of the present disclosure, an ith initialization signal SSi may be transmitted to the gate electrode G5 of the initialization transistor T5 through the ith initialization line SSLi. The initialization voltage Vinit may be transmitted to the drain electrode D5 of the initialization transistor T5 through the initialization power line VIL.

The capacitor Cst is connected between the gate electrode G1 of the driving transistor T1 and the reference node RN. That is, a first electrode Cst1 of the capacitor Cst is electrically connected with the gate electrode G1 of the driving transistor T1, and a second electrode Cst2 of the capacitor Cst is electrically connected with the reference node RN.

The correcting transistor T3 is connected between the bias line VBL and the reference node RN. According to an embodiment of the present disclosure, the correcting transistor T3 is connected between the masking transistor T4 and the bias line VBL. The drain electrode D3 of the correcting transistor T3 is electrically connected with the masking transistor T4. According to an embodiment of the present disclosure, the drain electrode D3 of the correcting transistor T3 may be electrically connected with a source electrode S4 of the masking transistor T4. The gate electrode G3 and the source electrode S3 of the correcting transistor T3 are electrically connected with the bias line VBL. According to an embodiment of the present disclosure, the bias voltage Vbi may be transmitted to the source electrode S3 and the gate electrode G3 of the correcting transistor T3 through the bias line VBL. According to an embodiment of the present disclosure, the bias voltage Vbi may have a voltage level lower than that of a threshold voltage of the correcting transistor T3. According to an embodiment of the present disclosure, the bias voltage Vbi may be a low-level voltage which turns off the correcting transistor T3.

The masking transistor T4 is connected between the reference node RN and the correcting transistor T3. The source electrode S4 of the masking transistor T4 is electrically connected with the drain electrode D3 of the correcting transistor T3. A drain electrode D4 of the masking transistor T4 is electrically connected with the reference node RN. A gate electrode G4 of the masking transistor T4 is electrically connected with the ith masking line MSLi. According to an embodiment of the present disclosure, an ith masking signal MSKi may be transmitted to the gate electrode G4 of the masking transistor T4 through the ith masking line MSLi.

Figure 6:
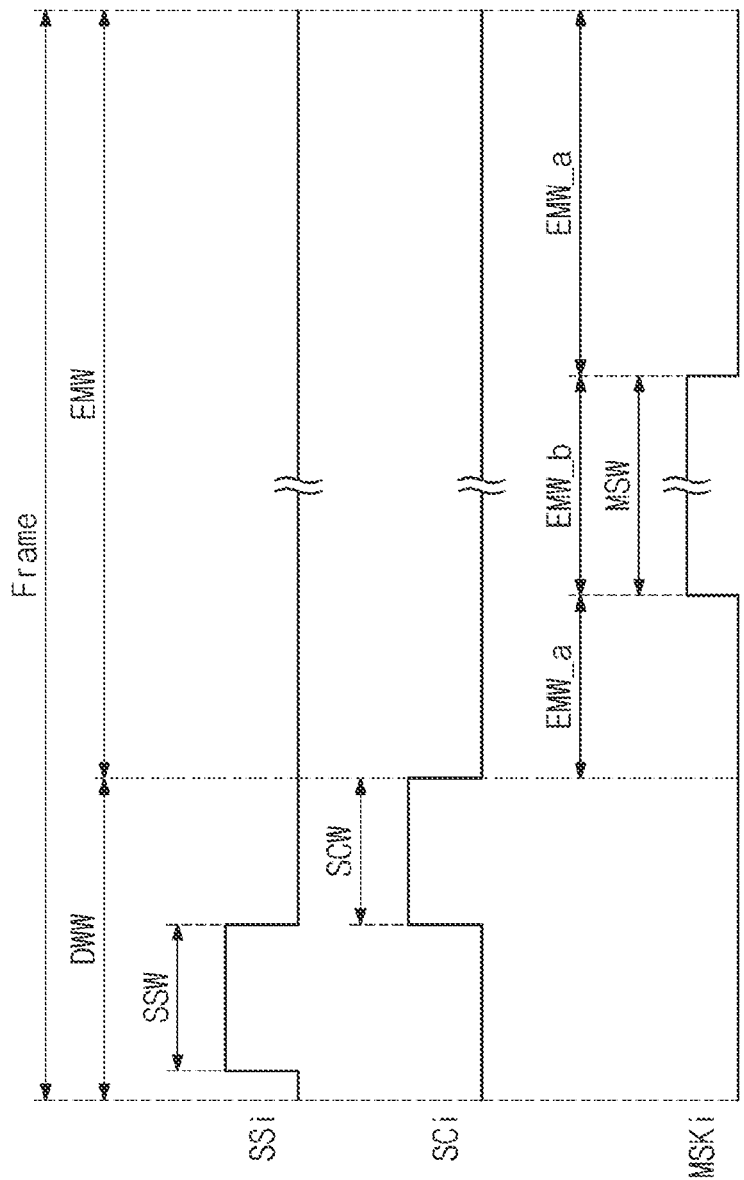
FIG. 6 is a waveform diagram of driving signals for driving the pixel illustrated in FIG. 5A.

FIG. 6 is a waveform diagram of driving signals for driving the pixel illustrated in FIG. 5A.

Referring to FIGS. 3, 5A, and 6, the display device DD (see FIG. 1) displays the image IM (see FIG. 1) through a plurality of frames. FIG. 6 illustrates any one frame of the plurality of frames. Each of the scan lines SCL1 to SCLn, the initialization lines SSL1 to SSLn, and the masking lines MSL1 to MSLn is sequentially scanned for one frame period.

Each of the ith scan signal SCi, the ith initialization signal SSi, and the ith masking signal MSKi may have a high level for a partial duration and a low level for a remaining duration. In this case, the N-type transistor is turned on when a signal received through a gate electrode has a high level, and a P-type transistor is turned on when a signal received through a gate electrode has a low level. According to an embodiment of the present disclosure, the following description will be made while focusing on that each of the driving transistor T1, the scan transistor T2, the correcting transistor T3, the masking transistor T4, and the initialization transistor T5, which are included in the pixel PX is an N-type transistor.

The ith initialization signal SSi is supplied to the ith initialization line SSLi in one frame. A high-level duration of the ith initialization signal SSi is defined as an initialization duration SSW. For the initialization duration SSW, the initialization transistor T5 is turned on. When the initialization transistor T5 is turned on, the initialization voltage Vinit is transmitted to the reference node RN through the initialization transistor T5. Accordingly, the reference node RN is initialized to the initialization voltage Vinit, and the source electrode S1 of the driving transistor T1 electrically connected with the reference node RN, and the driving electrode EL1 of the light emitting device ED electrically connected with the reference node RN are initialized to the initialization voltage Vinit.

Next, the ith scan signal SCi is supplied to the ith scan line SCLi. A high-level duration of the ith scan signal SCi is defined as a scan duration SCW. For the scan duration SCW, the scan transistor T2 is turned on. When the scan transistor T2 is turned on, the data signal DS is applied to the gate electrode G1 of the driving transistor T1 through the scan transistor T2. When the data signal DS is applied to the gate electrode G1 of the driving transistor T1, the driving transistor T1 may be turned on.

According to an embodiment of the present disclosure, the initialization duration SSW may precede the scan duration SCW in one frame. That is, the initialization duration SSW may happen before the scan duration SCW in one frame. In addition, the initialization duration SSW and the scan duration SCW may partially overlap each other. In the case, the voltage of the data signal DS is applied to the first electrode Cst1 of the capacitor Cst, and the initialization voltage Vinit is applied to the second electrode Cst2 of the capacitor Cst. Accordingly, charges corresponding to the voltage difference DS-Vinit across opposite terminal may be stored in the capacitor Cst.

Meanwhile, the common voltage ELVSS is applied to the common electrode EL2 of the light emitting device ED. Accordingly, when the initialization voltage Vinit having a voltage level lower than the voltage level of the common voltage ELVSS is applied to the driving electrode EL1 of the light emitting device ED, for the initialization duration SSW, a current does not flow through the light emitting device ED.

For the low-level duration of the ith scan signal SCi, the scan transistor T2 is turned off. For the low-level duration of the ith initialization signal SSi, the initialization transistor T5 is turned off. According to an embodiment of the present disclosure, the low-level duration of the ith scan signal SCi and the low-level duration of the ith initialization signal SSi may overlap with each other.

Even if the scan transistor T2 is turned off for the low-level duration of the ith scan signal SCi, the driving transistor T1 is maintained turned on by the charges stored in the capacitor Cst. Accordingly, a driving current Itr flows through the driving transistor T1. As charges are charged in an internal capacitor of the light emitting device ED due to the driving current Itr introduced through the driving transistor T1, a voltage level of the driving electrode EL1 of the light emitting device ED may gradually increase. When the voltage level of the driving electrode EL1 becomes higher than the voltage level of the common electrode EL2, the driving current Itr flows through the light emitting device ED, and the light emitting device ED emits light. In this case, even if the voltage level of the reference node RN is increased, the voltage level of the gate electrode G1 of the driving transistor T1 may increase due to a coupling effect of the capacitor Cst. Accordingly, the magnitude of the driving current Itr flowing through the driving transistor T1 may be maintained. According to an embodiment of the present disclosure, one frame may include a non-light emitting duration DWW and a light emitting duration EMW. The non-light emitting duration DWW includes the initialization duration SSW and the scan duration SCW. The light emitting duration EMW may be a duration after the scan duration SCW and may begin after the scan duration SCW. According to an embodiment of the present disclosure, the non-light emitting duration DWW may be a duration in which the light emitting device ED is prepared to emit light. The light emitting duration EMW may be a duration in which the light emitting device ED emits light. However, the present disclosure is not limited thereto. For example, the light emitting device ED may emit light for a partial duration of the non-light emitting duration DWW.

The ith masking signal MSKi is supplied to the ith masking line MSLi for the light emitting duration EMW. A high-level duration of the ith masking signal MSKi is defined as a masking duration MSW. The masking transistor T4 is turned on for the masking duration MSW. According to an embodiment of the present disclosure, the scan duration SCW may precede the masking duration MSW. However, the scan duration SCW and the masking duration MSW do not overlap each other.

According to an embodiment of the present disclosure, the light emitting duration EMW includes a first light emitting duration EMW_a, for which the masking transistor T4 is turned off, and a second light emitting duration EMW_b for which the masking transistor T4 is turned on.

Referring to FIGS. 4, 5, and 6, the gate electrode G3 and the source electrode S3 of the correcting transistor T3 are electrically connected with the bias line VBL. Since the bias voltage Vbi lower than the threshold voltage is applied to the correcting transistor T3, the correcting transistor T3 may be turned off. According to an embodiment of the present disclosure, although the bias line VBL to apply the bias voltage Vbi to the correcting transistor T3 is illustrated, the present disclosure is not limited thereto. As illustrated in FIG. 5B, the gate electrode G3 and the source electrode S3 of the correcting transistor T3 may be electrically connected with the common electrode EL2. In this case, the common voltage ELVSS may be applied to the gate electrode G3 and the source electrode S3 of the correcting transistor T3 through the common electrode EL2. According to an embodiment of the present disclosure, the semiconductor pattern of the correcting transistor T3 may include a light-sensitive semiconductor material. For the light emitting duration EMW, the semiconductor pattern of the correcting transistor T3 may absorb energy of light produced by the light emitting device ED to generate charges. According to an embodiment of the present disclosure, the channel area AE2 (see FIG. 4) of the correcting transistor T3 may absorb the energy of light produced by the light emitting device ED and may generate charges in the light emitting duration EMW. A leakage current Ipt may flow through the correcting transistor T3 due to the produced charge.

Since the masking transistor T4 is turned off for the first light emitting duration EMW_a, a current may not flow from the reference node RN to the correcting transistor T3. However, since the masking transistor T4 is turned on for the second light emitting duration EMW_b, the leakage current Ipt may flow through the correcting transistor T3 even if the correcting transistor T3 is turned off. In this case, the driving current Itr flowing through the driving transistor T1 is divided into a light emitting current Iel flowing to the light emitting device ED and the leakage current Ipt flowing to the bias line VBL through the masking transistor T4 and the correcting transistor T3. Since the light emitting current Iel is reduced by the leakage current Ipt, the brightness of light output from the light emitting device ED may be decreased. The relationship between the light emitting current Iel and the leakage current Ipt will be described later with reference to FIGS. 10A, 10B, 11A, and 11B.

Figure 7:
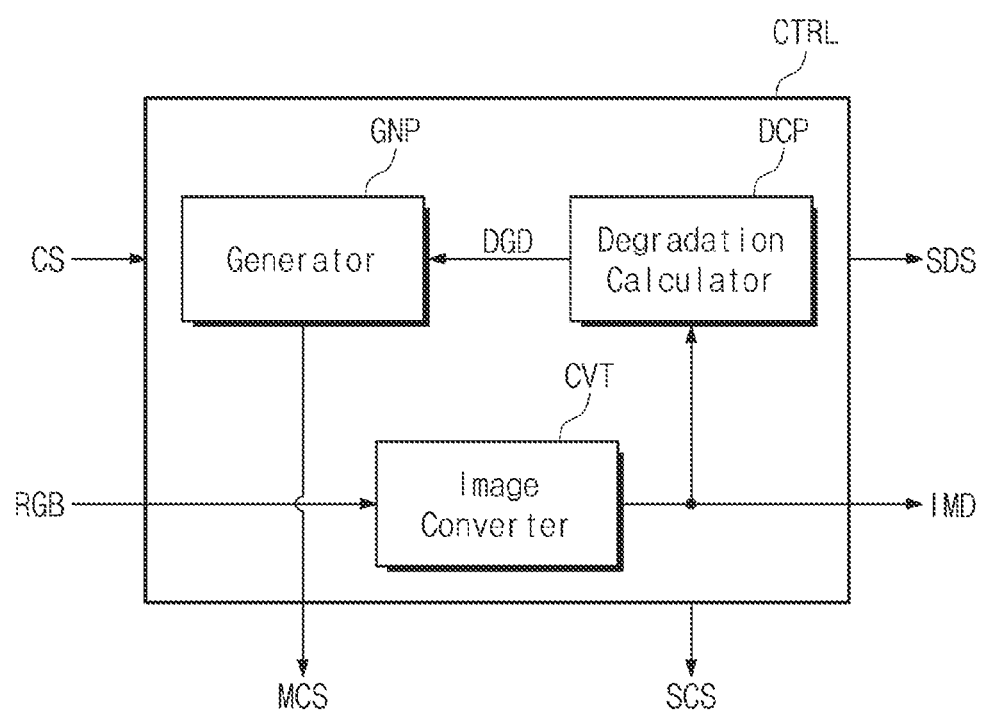
FIG. 7 is a diagram illustrating a structure of a controller, according to an embodiment of the present disclosure.
Figure 8:
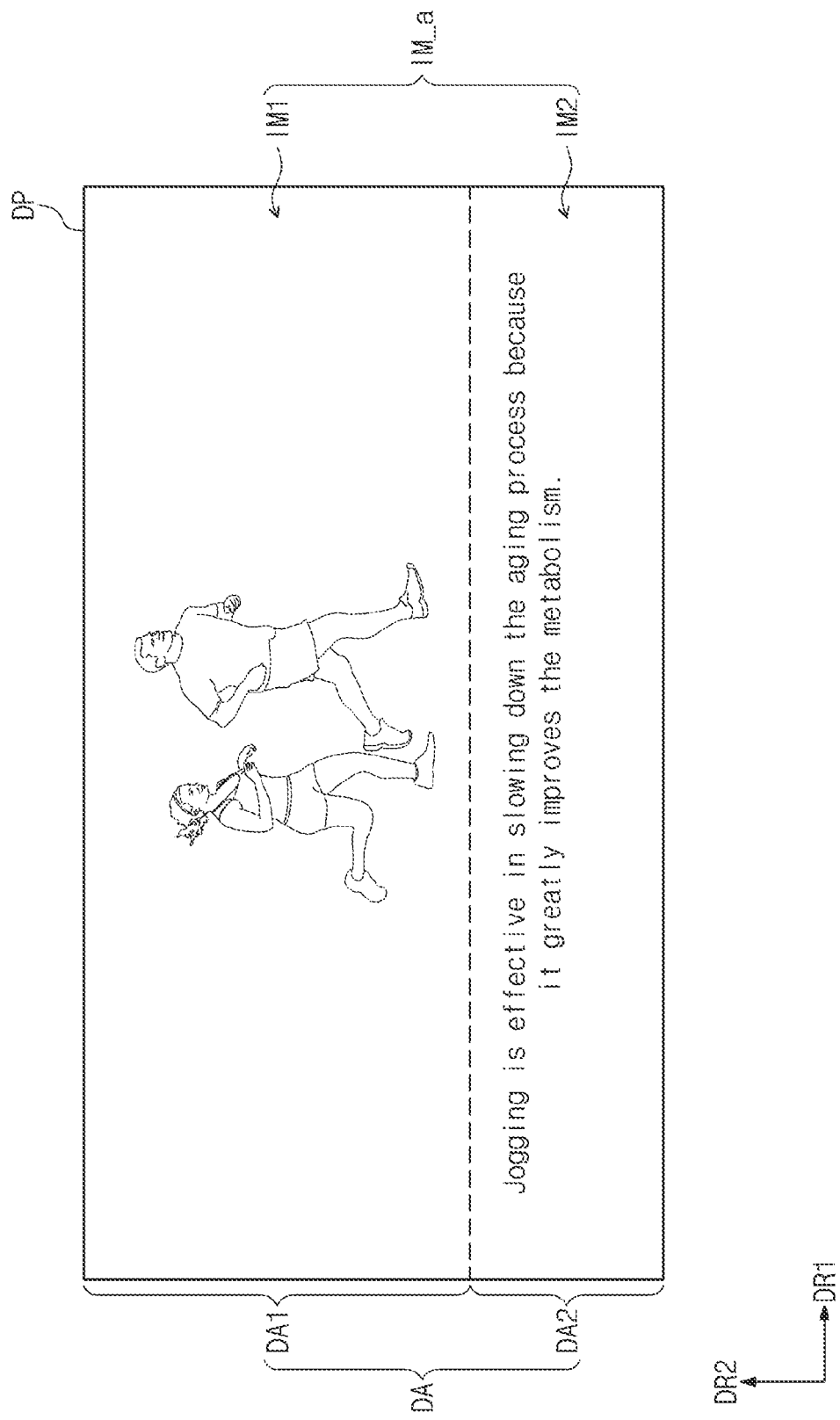
FIG. 8 is a conceptual view illustrating an operation of a degradation calculator, according to an embodiment of the present disclosure.
Figure 9:
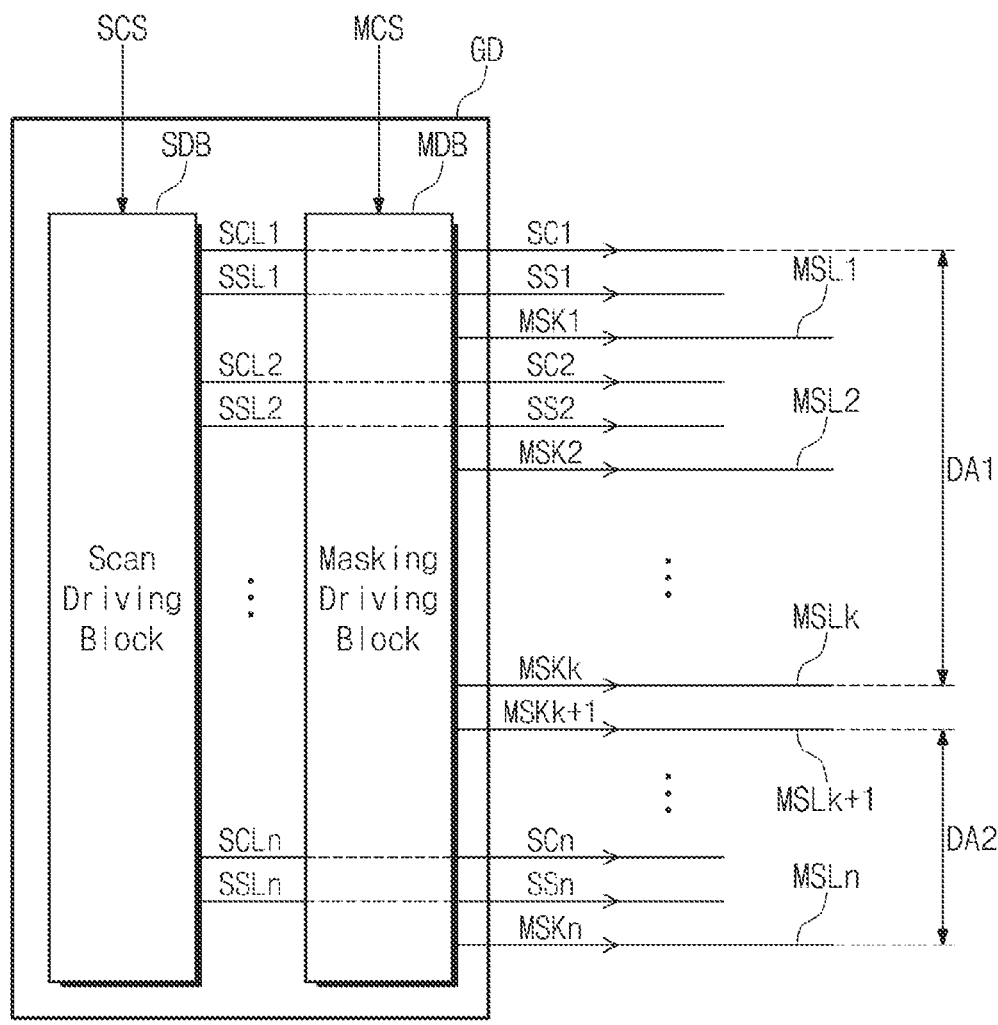
FIG. 9 is a diagram illustrating an operation of a gate driver, according to an embodiment of the present disclosure.
Figure 9:
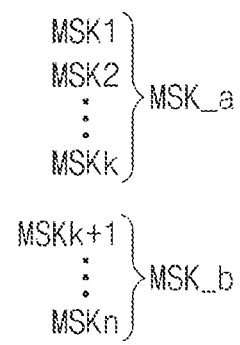

FIG. 7 is a diagram illustrating a structure of a controller, according to an embodiment of the present disclosure. FIG. 8 is a conceptual view illustrating an operation of a degradation calculator, according to an embodiment of the present disclosure. FIG. 9 is a diagram illustrating an operation of a gate driver, according to an embodiment of the present disclosure.

Referring to FIGS. 7, 8, and 9, the controller CTRL may include an image converter CVT, a degradation calculator DCP, and a generator GNP.

The image converter CVT receives the image signal RGB from an external source, and transforms a data format of the image signal RGB to generate image data IMD to be matched with the specification of the interface with the source driver SD (see FIG. 3).

The degradation calculator DCP receives the image data IMD from the image converter CVT for every frame. The degradation calculator DCP accumulates image data IMD received for every frame, and generates degradation data DGD based on image data previously accumulated. According to an embodiment of the present disclosure, the degradation data DGD includes a plurality of degradation values representing a degree that the light emitting device ED (see FIG. 5A) included in each pixel PX is degraded over the driving time. According to an embodiment of the present disclosure, the degradation value of the light emitting device ED may be determined depending on a driving frequency of the display panel DP, the length of a light emitting duration of each pixel PX in one frame, the brightness of each pixel PX, or the total light emitting time of each pixel PX. According to an embodiment of the present disclosure, even if data signals DS (see FIG. 3) having equal gray scales are applied, a quantity of light produced by the light emitting device having a greater degradation value is less than a quantity of light produced by a light emitting device having a less degradation value. In addition, even the degradation value of the correcting transistor T3 (see FIG. 5A), which absorbs the energy of light produced by the light emitting device ED and produces charges, may increase, as the degradation value of the light emitting device increases.

According to an embodiment of the present disclosure, an image IM_a displayed on the display panel DP may include a first image IM1 and a second image IM2. According to an embodiment of the present disclosure, the second image IM2 may be an image displayed in a specific gray level at a fixed position for a specific time. For example, the second image IM2 may include a caption, a broadcaster logo, a date, a program title. However, the present disclosure is not limited thereto. The first image IM1 may be an image displayed at a peripheral portion of the second image IM2.

According to an embodiment of the present disclosure, the display area DA includes a first display area DA1, in which the first image IM1 is displayed, and a second display area DA2 in which the second image IM2 is displayed. The degradation data DGD includes first degradation data, which includes degradation values of light emitting devices ED and the correcting transistors T3 of first pixels included in the first display area DA1, and second degradation data which includes degradation values of light emitting devices ED and correcting transistors T3 of second pixels included in the second display area DA2. According to an embodiment of the present disclosure, the first degradation value included in the first degradation data may be different from the second degradation value included in the second degradation data. According to an embodiment of the present disclosure, the second degradation value may be greater than the first degradation value. However, the present disclosure is not limited thereto. For example, the second degradation value may be less than the first degradation value depending on the types of the first image IM1 and the second image IM2 displayed in the display panel DP. In addition, the degradation data DGD may include at least two degradation data having mutually different degradation values, depending on the types of the images IM displayed on the display panel DP.

The generator GNP receives the degradation data DGD from the degradation calculator DCP. The generator GNP may generate the masking control signal MCS, based on the degradation data DGD. According to an embodiment of the present disclosure, the degradation data DGD may include first and second degradation data. The generator GNP may generate the masking control signal MCS, based on the first degradation data and the second degradation data. According to an embodiment of the present disclosure, the generator GNP may generate the masking control signal MCS, in response to the control signal CS and the degradation data DGD. The masking control signal MCS may include a masking start signal for starting the operation of a masking driving block MDB, and a masking clock signal for determining output timing of the masking signals MSK1 to MSKn.

The controller CTRL may generate the scan control signal SCS, in response to the control signal CS. The scan control signal SCS includes a scan start signal for starting the operation of a scan driving block SDB, and a scan clock signal for determining output timing of the scan signals SC1 to SCn and the initialization signals SS1 to SSn The gate driver GD includes the scan driving block SDB and the masking driving block MDB. The scan driving block SDB receives the scan control signal SCS from the controller CTRL. The scan driving block SDB generates the scan signals SC1 to SCn, in response to the scan control signal SCS, and sequentially outputs the scan signals SC1 to SCn to the scan lines SCL1 to SCLn. The scan driving block SDB generates the initialization signals SS1 to SSn in response to the scan control signal SCS and sequentially outputs the initialization signals SS1 to SSn to the initialization lines SSL1 to SSLn.

The masking driving block MDB receives the masking control signal MCS from the controller CTRL. The masking driving block MDB generates the masking signals MSK1 to MSKn in response to the masking control signal MCS and sequentially outputs the masking signals MSK1 to MSKn to the masking lines MSL1 to MSLn. According to an embodiment of the present disclosure, when the masking control signal MCS is generated based on the first and second degradation data, the masking driving block MDB may generate a first masking signal MSK_a applied to the first pixels disposed in the first display area DA1, and a second masking signal MSK_b applied to the second pixels disposed in the second display area DA2. According to an embodiment of the present disclosure, the first pixels are pixels connected with relevant masking lines of the first to kth masking lines MSL1 to MSLk. The second pixels are pixels connected with relevant masking lines of (k+1)th to nth masking lines MSLk+1 to MSLn.

Figure 10A:
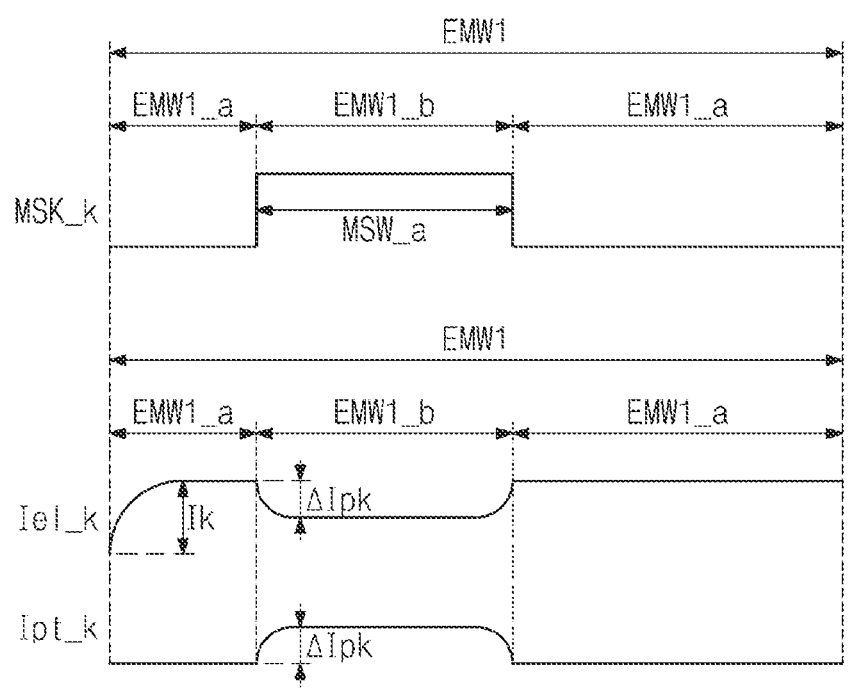
FIG. 10A is a waveform diagram illustrating a masking signal, and currents flowing through a corrector and a generator, in a first display area, according to an embodiment of the present disclosure.
Figure 10B:
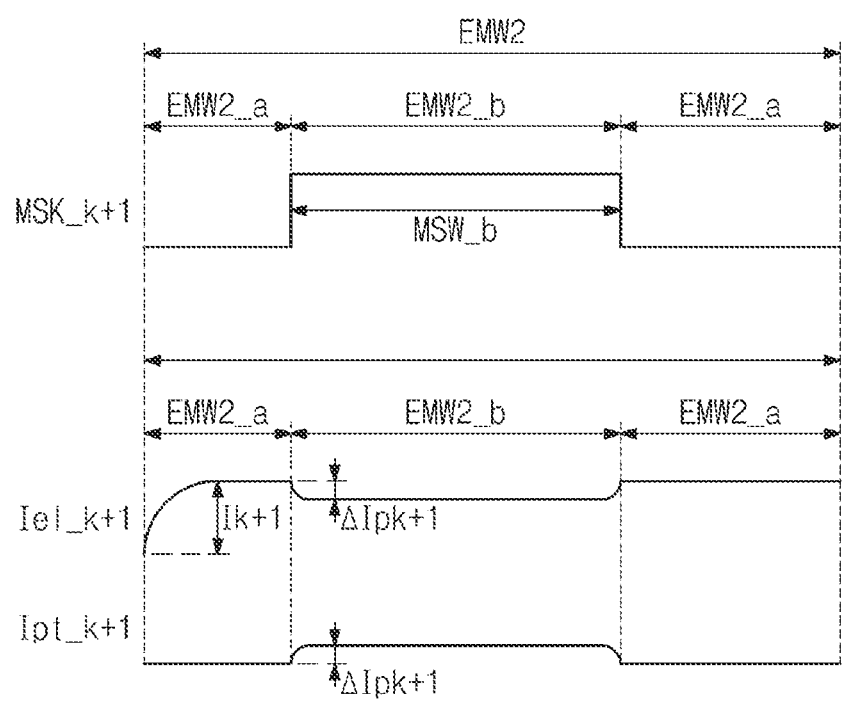
FIG. 10B is a waveform diagram illustrating a masking signal, and currents flowing through a corrector and a generator, in a second display area, according to an embodiment of the present disclosure.

FIG. 10A is a waveform diagram illustrating a masking signal, and currents flowing through a corrector and a generator in a first display area, according to an embodiment of the present disclosure. FIG. 10B is a waveform diagram illustrating a masking signal, and currents flowing through a corrector and a generator in a second display area, according to an embodiment of the present disclosure. Hereinafter, the signals and the durations described with reference to FIG. 6 will be assigned with the same reference numerals as those of FIG. 6, and the details thereof will be omitted.

FIG. 10A illustrates a kth masking signal MSK_k, a light emitting current Iel_k of a kth pixel, which receives the kth masking signal MSK_k, and a leakage current Ipt_k of the kth pixel receiving the kth masking signal MSK_k for a light emitting duration EMW1 in one frame.

Referring to FIGS. 5A, 6, and 10A, according to an embodiment of the present disclosure, the sum of the light emitting current Iel_k and the leakage current Ipt_k for the light emitting duration EMW1 is equal to the driving current Itr. For a first light emitting duration EMW1_a, since the masking transistor T4 is turned off, the leakage current Ipt_k is not generated. A first light emitting value & of the light emitting current Iel_k is equal to the driving current Itr for the first light emitting duration EMW1_a. For a second light emitting duration EMW1_b, since the masking transistor T4 is turned on, the leakage current Ipt_k is generated. According to an embodiment of the present disclosure, the magnitude of the leakage current Ipt_k is proportional to the intensity of light generated produced by the light emitting device ED. A first leakage value ΔIpk of the leakage current Ipt_k for the second light emitting duration EMW1_b is proportional to the value of the light emitting current Iel_k flowing through the light emitting device ED, when the masking transistor T4 is turned on. According to an embodiment of the present disclosure, a second light emitting value for the second light emitting duration EMW1_b may be a value Ik−ΔIpk which is obtained by subtracting the first leakage value ΔIpk of the leakage current Ipt_k from a first light emitting value & equal to the value of the driving current Itr. According to an embodiment of the present disclosure, the first leakage value ΔIpk is proportional to the intensity of light produced by the light emitting device ED. A quantity of light, which is corrected by the leakage current Ipt_k flowing through the corrector LCP, is proportional to the width of a first masking duration MSW_a and the first leakage value ΔIpk for the light emitting duration EMW1.

FIG. 10B illustrates a (k+1)th masking signal MSK_k+1, a light emitting current Iel_k+1 of a (k+1)th pixel, which receives the (k+1)th masking signal MSK_k+1, and a leakage current Ipt_k+1 of the (k+1)th pixel receiving the (k+1)th masking signal MSK_k+1 for a light emitting duration EMW2 in one frame.

Referring to FIGS. 5A, 6, and 10B, according to an embodiment of the present disclosure, the sum of the light emitting current Iel_k+1 and the leakage current Ipt_k+1 for the light emitting duration EMW2 is equal to the driving current Itr. A third light emitting value Ik+1 of the light emitting current Iel_k+1 is equal to the driving current Itr for a first light emitting duration EMW2_a. According to an embodiment of the present disclosure, since a second degradation value of the (k+1)th pixel included in the second display area DA2 (see FIG. 9) is greater than a first degradation value of the kth pixel included in the first display area DA1 (see FIG. 9), even if the size of the first light emitting value & is equal to that of the third light emitting value Ik+1, a quantity of light produced by the light emitting device included in the kth pixel may be less than a quantity of light produced by the light emitting device included in the (k+1)th pixel.

The leakage current Ipt_k+1 is generated for the second light emitting duration EMW2_b. The second leakage value ΔIpk+1 of the leakage current Ipt_k+1 is proportional to the intensity of light produced by the light emitting device ED in which the masking transistor T4 is to be turned on. Since a quantity of light produced by the light emitting device of the (k+1)th pixel is smaller than a quantity of light generated by the light emitting device of the kth pixel, due to degradation, the second leakage value ΔIpk+1 may be less than the first leakage value ΔIpk. According to an embodiment of the present disclosure, a fourth light emitting value for the second light emitting duration EMW2_b may be a value obtained by subtracting the second leakage value ΔIpk+1 from the third light emitting value Ik+1 equal to the value of the driving current Itr. That is, the fourth light emitting value is equal to Ik+1−ΔIpk+1 or Itr−ΔIpk+1. A quantity of light, which is corrected by the leakage current Ipt_k+1 flowing through the corrector LCP, is proportional to the width of a second masking duration MSW_b and the second leakage current ΔIpk+1.

Accordingly, even if the quantity of light produce by the light emitting unit included in the (k+1)th pixel is smaller than the quantity of light produced by the light emitting unit included in the kth pixel, different degradation values of the pixels PX (see FIG. 3) may be compensated, through a negative feedback in which the magnitude of the second leakage value ΔIpk+1 is less than the first leakage value ΔIpk. Accordingly, even if the light emitting devices ED included in the pixels PX show mutually different degradation levels, the light emitting devices ED may output light having equal brightness at an equal grayscale. Accordingly, the display quality of the display device DD (see FIG. 1) may be improved.

In addition, according to an embodiment of the present disclosure, the masking driving block MDB (see FIG. 9) may be configured that the width of the first masking duration MSW_a is different from the width of the second masking duration MSW_b. According to an embodiment of the present disclosure, the width of the second masking duration MSW_b may be greater than the width of the first masking duration MSW_a. According to an embodiment of the present disclosure, when a second degradation value of the (k+1)th pixel is greater than a first degradation value of the kth pixel, a degradation value of the correcting transistor T3 at the (k+1)th pixel may be greater than a degradation value of the correcting transistor T3 at the kth pixel. In this case, even if the same light is applied, the magnitude of the leakage current, which is generated from the correcting transistor T3 at the (k+1)th pixel may be less than the magnitude of the leakage current generated from the correcting transistor T3 at the kth pixel. In this case, the width of the second masking duration MSW_b is made to be greater than the width of the first masking duration MSW_a, thereby compensating for the difference between the degradation value of the correcting transistor T3 at the (k+1)th pixel and the degradation value of the correcting transistor T3 at the kth pixel. Accordingly, even if the correcting transistors T3 included in the pixels PX show different degradation extents, a level of compensating for a quantity of light may be constantly controlled with respect to the pixels PX. Accordingly, equal brightness may be output at an equal grayscale.

Figure 11A:
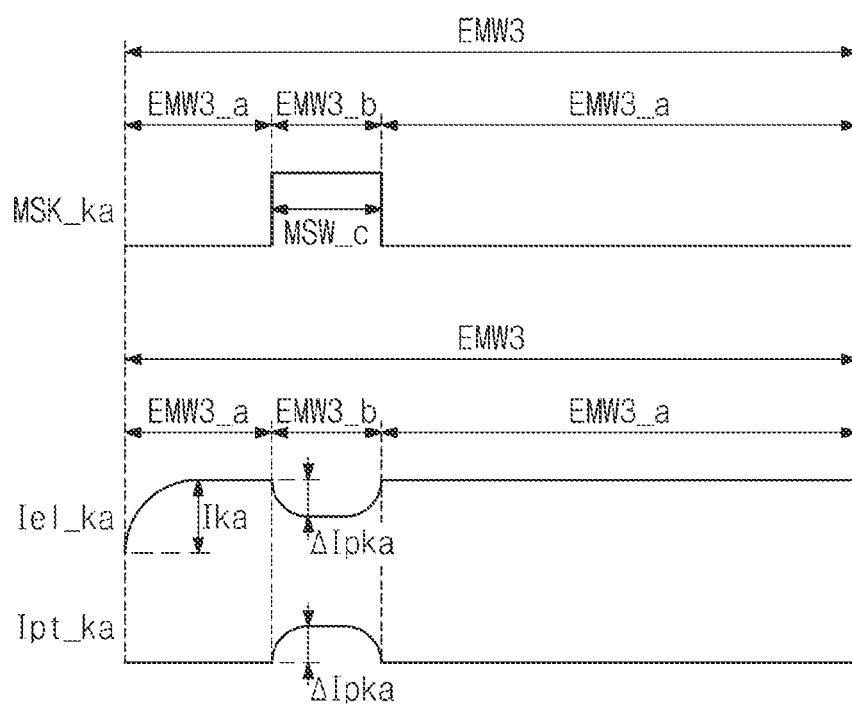
FIG. 11A is a waveform diagram illustrating a masking signal, and currents flowing through a corrector and a generator in a first display area, according to an embodiment of the present disclosure.
Figure 11B:
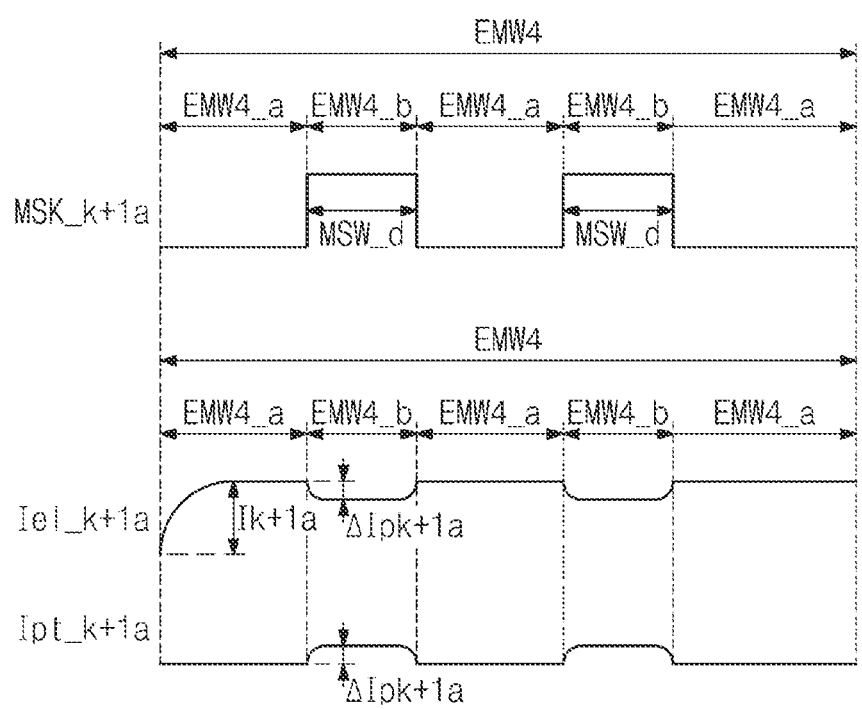
FIG. 11B is a waveform diagram illustrating a masking signal, and currents flowing through a corrector and a generator in a second display area, according to an embodiment of the present disclosure.

FIG. 11A is a waveform diagram illustrating a masking signal, and currents flowing through a corrector and a generator in a first display area, according to an embodiment of the present disclosure. FIG. 11B is a waveform diagram illustrating a masking signal, and currents flowing through a corrector and a generator in a second display area, according to an embodiment of the present disclosure. Hereinafter, the signals and the durations described with reference to FIGS. 6, 10A, and 10B will be assigned with the same reference numerals as those of FIGS. 6, 10A, and 10B, and the details thereof will be omitted.

Referring to FIGS. 5A, 9, 11A, and 11B, according to an embodiment of the present disclosure, the masking driving block MDB may generate kth and (k+1)th masking signals MSK_ka and MSK_k+1a, such that the number of first masking durations MSW_c included in the kth masking signal MSK_ka is different from the number of second masking durations MSW_d included in the (k+1)th masking signal MSK_k+1a. According to an embodiment of the present disclosure, when the second degradation value is greater than the first degradation value, the masking driving block MDB may generate the kth and (k+1)th masking signals MSK_ka and MSK_k+1a, such that the number of the second masking durations MSW_d included in the (k+1)th masking signal MSK_k+1a is greater than the number of the first masking durations MSW_c included in the kth masking signal MSK_ka. According to an embodiment of the present disclosure, the masking driving block MDB may generate the kth and (k+1)th masking signals MSK_ka and MSK_k+1a, such that the kth masking signal MSK_ka includes one first masking duration MSW_c, and the (k+1)th masking signal MSK_k+1a includes two second masking durations MSW_d. According to an embodiment of the present disclosure, the width of the first masking duration MSW_c included in the kth masking signal MSK_ka may be equal to the width of the second masking duration MSW_d included in the (k+1)th masking signal MSK_k+1a. However, the present disclosure is not limited thereto. For example, the width of the second masking duration MSW_d may be greater than the width of the first masking duration MSW_c. The sum of the widths of the second masking durations MSW_d included in the (k+1)th masking signal MS K_k+1a is greater than the sum of the widths of the first masking durations MSW_c included in the kth masking signal MSK_ka. Accordingly, even if the degradation value of the correcting transistor T3 at the (k+1)th pixel is greater than the degradation value of the correcting transistor T3 at the kth pixel, the level of the negative feedback by the correcting transistor T3 of the kth pixel may be equal to the level of the negative feedback by the correcting transistor T3 at the (k+1)th pixel.

In detail, for a first light emitting duration EMW3_a of FIG. 11A, since the masking transistor T4 is turned off, the leakage current Ipt_ka is not generated. A fifth light emitting value Ika of the light emitting current Iel_ka is equal to the value of the driving current Itr for the first light emitting duration EMW3_a. For a second light emitting duration EMW3_b, since the masking transistor T4 is turned on, the leakage current Ipt_ka is generated. According to an embodiment of the present disclosure, a sixth light emitting value for the second light emitting duration EMW3_b may be a value Ika-ΔIpka which is obtained by subtracting a first leakage value ΔIpka of the leakage current Ipt_ka from the fifth light emitting value Ika equal to the value of the driving current Itr.

For a first light emitting duration EMW4_a of FIG. 11B, since the masking transistor T4 is turned off, the leakage current Ipt_k+1a is not generated. A seventh light emitting value Ik+1a of the light emitting current Iel_k+1a is equal to the driving current Itr for the first light emitting duration EMW4_a. For a second light emitting duration EMW4_b, since the masking transistor T4 is turned on, the leakage current Ipt_k+1a is generated. According to an embodiment of the present disclosure, an eighth light emitting value for the second light emitting duration EMW4_b may be obtained by subtracting a second leakage value ΔIpk+1a of the leakage current Ipt_k+1a from the seventh light emitting value Ik+1a equal to the value of the driving current Itr. That is, the value of the second light emitting duration EMW4_b is equal to Ik+1a−ΔIpk+1a or Itr−ΔIpk+1a. According to an embodiment of the present disclosure, the second leakage value ΔIpk+1a may be less than the first leakage value ΔIpka. In this case, the sum of the widths of the second light emitting durations EMW4_b corresponding to the (k+1)th masking signal MS K_k+1a is greater than the width of the second light emitting duration EMW3_b corresponding to the kth masking signal MSK_ka. Accordingly, even if the light emitting devices ED included in the pixels PX show mutually different degradation levels, the light emitting devices ED may output light having equal brightness at an equal grayscale. Accordingly, the display quality of the display device DD (see FIG. 1) may be improved.

According to the present disclosure, the pixel may include a light emitting device, and a light receiving device which receives light emitted from the light emitting device, and varies a current flowing depending on a quantity of the light. The quantity of light produced by the light emitting device may be corrected by the light receiving device. Accordingly, even if deterioration degrees of the light emitting devices ED included in the pixels PX are different from each other, the light emitting devices ED emit light of the same intensities at the same gray level. Accordingly, the display device may provide, to the user, the image having excellent display quality.

Although an embodiment of the present disclosure has been described for illustrative purposes, those skilled in the art will appreciate that various modifications, and substitutions are possible, without departing from the scope and spirit of the invention as disclosed in the accompanying claims.

Accordingly, the technical scope of the present disclosure is not limited to the detailed description of this specification, but should be defined by the claims.

While the present disclosure has been described with reference to embodiments thereof, it will be apparent to those of ordinary skill in the art that various changes and modifications may be made thereto without departing from the spirit and scope of the present disclosure as set forth in the following claims.

What is claimed is:

1. A display device comprising:
a display panel including a plurality of pixels, wherein each of the pixels includes:
a light emitting device connected with a reference node to emit light;
a driving transistor connected between a power line for receiving a power supply voltage and the reference node;
a scan transistor connected between a data line for receiving a data signal and the driving transistor, and configured to receive a scan signal;
a light receiving device connected between a bias line for receiving a bias voltage and the reference node, and configured to receive the light; and
a masking transistor connected between the reference node and the light receiving device and configured to receive a masking signal.

2. The display device of claim 1, wherein the light receiving device includes:
a correcting transistor having a first electrode connected with the bias line, a second electrode connected with the masking transistor, and a control electrode connected with the bias line.

3. The display device of claim 2, wherein the masking transistor includes:
a first electrode connected with the second electrode of the correcting transistor, a second electrode connected with the reference node, and a control electrode to receive the masking signal.

4. The display device of claim 2, wherein the light emitting device is connected between a common electrode for receiving a common voltage and the reference node, and wherein the common voltage serves as the bias voltage and is supplied to the correcting transistor.

5. The display device of claim 1, wherein the driving transistor includes:
a first electrode connected with the reference node;
a second electrode connected with the power line; and
a control electrode connected with the scan transistor, and wherein the scan transistor includes:
a first electrode connected with the control electrode of the driving transistor, a second electrode connected with the data line, and a control electrode to receive the scan signal.

6. The display device of claim 1, wherein the scan signal includes:
a scan duration for turning on the scan transistor, wherein the masking signal includes:
a masking duration for turning on the masking transistor, and
wherein the scan duration precedes the masking duration in a frame.

7. The display device of claim 6, wherein the scan duration and the masking duration do not overlap each other in the frame.

8. The display device of claim 1, further comprising:
a capacitor connected between a control electrode of the driving transistor and the reference node; and
an initialization transistor connected between the reference node and an initialization line, and configured to receive an initialization voltage,
wherein the initialization transistor includes:
a first electrode connected with the reference node;
a second electrode connected with the initialization line; and
a control electrode to receive an initialization signal.

9. The display device of claim 8, wherein the scan signal includes:
a scan duration for turning on the scan transistor, wherein the masking signal includes:
a masking duration for turning on the masking transistor,
wherein the initialization signal includes:
an initialization duration for turning on the initialization transistor, and
wherein the initialization duration precedes the scan duration, and the scan duration precedes the masking duration in a frame.

* * * * *